United States Patent
Xin et al.

(10) Patent No.: US 12,211,856 B2
(45) Date of Patent: Jan. 28, 2025

(54) DISPLAY PANEL WITH DISLOCATED SIGNAL LINES AND DISPLAY DEVICE WITH DISLOCATED SIGNAL LINES

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Yu Xin, Shanghai (CN); Lijing Han, Shanghai (CN); Baoyan Chai, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 618 days.

(21) Appl. No.: 17/406,016

(22) Filed: Aug. 18, 2021

(65) Prior Publication Data
US 2021/0384226 A1 Dec. 9, 2021

(30) Foreign Application Priority Data
Jun. 1, 2021 (CN) .......................... 202110610710.6

(51) Int. Cl.
H01L 27/14 (2006.01)
H01L 27/12 (2006.01)

(52) U.S. Cl.
CPC ........ *H01L 27/124* (2013.01); *H01L 27/1255* (2013.01)

(58) Field of Classification Search
CPC .............. H01L 27/124; H01L 27/1255; H01L 27/1248; H10K 59/131
USPC ............................................... 257/59, 71, 72
See application file for complete search history.

(56) References Cited

U.S. PATENT DOCUMENTS 10,718,983 B2 * 7/2020 Sasaki ............... G02F 1/136286

FOREIGN PATENT DOCUMENTS

CN 109449180 A 3/2019
WO WO 2021/097754 A1 5/2021

* cited by examiner

*Primary Examiner* — Tan N Tran
(74) *Attorney, Agent, or Firm* — ALSTON & BIRD LLP

(57) ABSTRACT

Provided are a display panel and a display device. The display panel includes a base substrate, and a first signal line and a second signal line that are located on a side of the base substrate. Both the first signal line and the second signal line are located in a first metal layer and extend along a first direction. The distance between at least part of a surface of the first signal line facing the base substrate and a plane where the base substrate is located is defined by D1. The distance between at least part of a surface of the second signal line facing the base substrate and the plane where the base substrate is located is defined by D2, such that D2 is not equal to D1.

11 Claims, 20 Drawing Sheets ature and the data signal line extends in the same direction. However, with the

DISPLAY PANEL WITH DISLOCATED SIGNAL LINES AND DISPLAY DEVICE WITH DISLOCATED SIGNAL LINES

CROSS-REFERENCE TO RELATED APPLICATION

This application claims priority to Chinese Patent Application No. 202110610710.6 filed Jun. 1, 2021, the disclosure of which is incorporated herein by reference in its entirety

TECHNICAL FIELD

The present disclosure relates to the field of display technologies and, in particular, to a display panel and a display device.

BACKGROUND

With the development of display technology, the organic light emitting diode (OLED) and the liquid crystal display (LCD) have gradually become two major display panels.

The display panel includes sub-pixels and multiple signal lines. The signal lines are used for supplying drive signals to the sub-pixels for driving the sub-pixels to emit light. For example, the power signal line is used for supplying a power voltage signal to the sub-pixels, and the data signal line is used for supplying a data voltage signal to the sub-pixels, where the magnitude of the data voltage signal affects the brightness of the light emitted by the sub-pixels.

In the display panels currently on the market, the power signal line and the data signal line are usually disposed in the same metal layer, and the power signal line and the data signal line extend in the same direction. However, with the development of the display panel towards high resolution, the spacing between the power signal line and the data signal line is decreased, and the coupling capacitance formed between the power signal line and the data signal line is large, which leads to the interference between the power voltage signal and the data voltage signal, thereby affecting the display effect.

SUMMARY

The present disclosure provides a display panel and a display device, to reduce the coupling capacitance between the signal lines, improve the problem of signal crosstalk, and thus improve the display effect.

In a first aspect, an embodiment of the present disclosure provides a display panel. The display panel includes: a base substrate; and a first signal line and a second signal line that are located on a side of the base substrate, where both the first signal line and the second signal line are located in a first metal layer and extend along a first direction. The distance between at least part of a surface of the first signal line facing the base substrate and a plane where the base substrate is located is D1, and the distance between at least part of a surface of the second signal line facing the base substrate and the plane where the base substrate is located is D2, where D1 is not equal to D2.

In a second aspect, an embodiment of the present disclosure further provides a display device. The display device includes the display panel described in any one of embodiments of the present disclosure.

DETAILED DESCRIPTION

Figure 1:
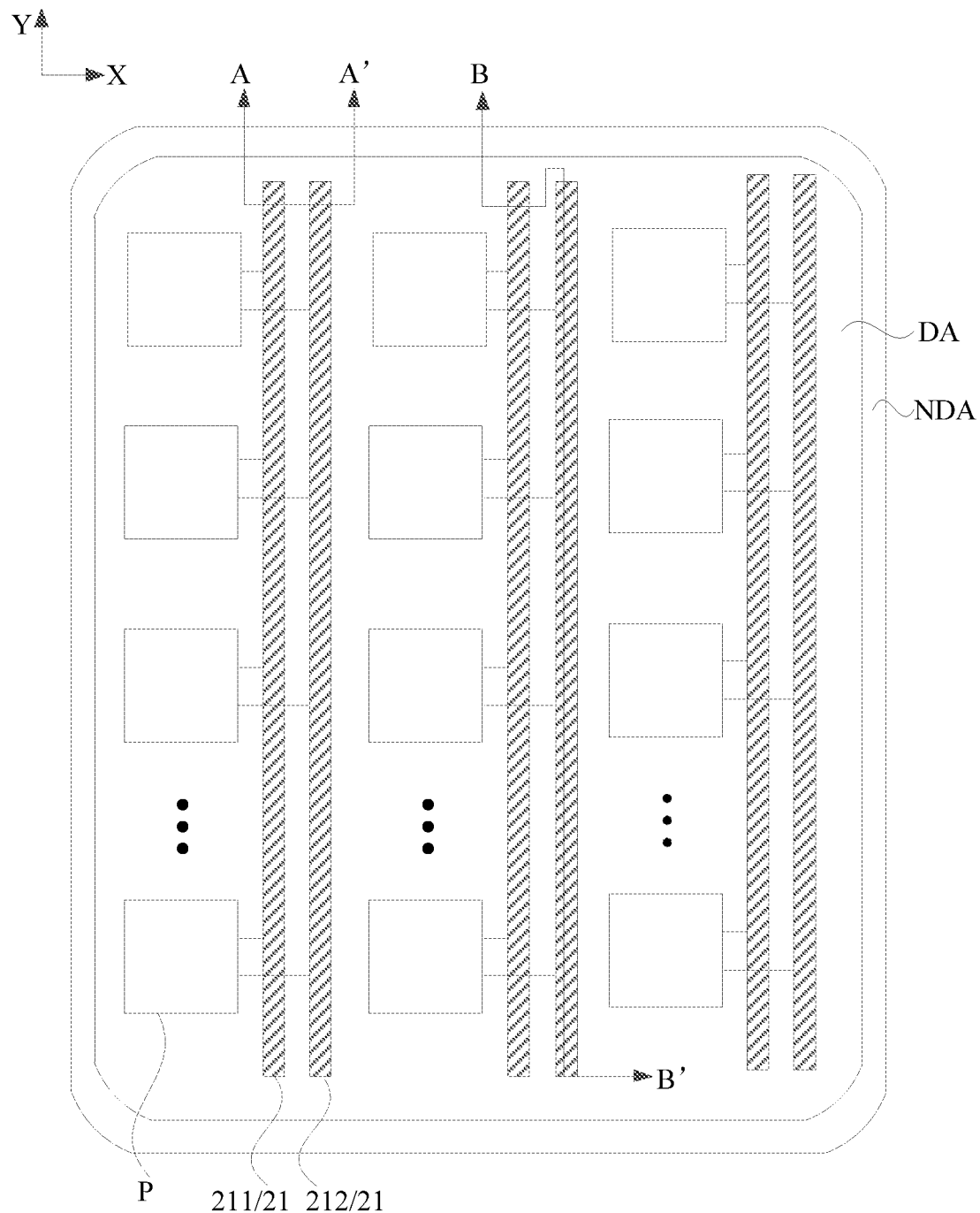
FIG. 1 is a structure diagram of a display panel according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

In view of the problem mentioned in Background, an embodiment of the present disclosure provides a display panel. The display panel includes a base substrate; and a first signal line and a second signal line that are located on a side of the base substrate. Both the first signal line and the second signal line are located in a first metal layer and extend along a first direction. The distance between at least part of a surface of the first signal line facing the base substrate and the plane where the base substrate is located is D1, and the distance between at least part of a surface of the second signal line facing the base substrate and the plane on which the base substrate is located is D2, where D1 is not equal to D2. Through the preceding technical scheme, along the direction perpendicular to the plane where the base substrate is located, at least part of the first signal line and at least part of the second signal line can be dislocated from each other and not at the same height so that the space distance between the first signal line and the second signal line increases, thereby reducing the coupling capacitance between the first signal line and the second signal line, improving the problem of signal crosstalk, and achieving the purpose of improving the display effect.

The preceding is one aspect of the present disclosure. Technical solutions in embodiments of the present disclosure are described clearly and completely below in conjunction with the drawings in embodiments of the present disclosure. The embodiments described below are part, not all, of embodiments of the present disclosure. Based on embodiments of the present disclosure, all other embodiments obtained by those of ordinary skill in the art without creative work are within the scope of the present disclosure.

Figure 2:
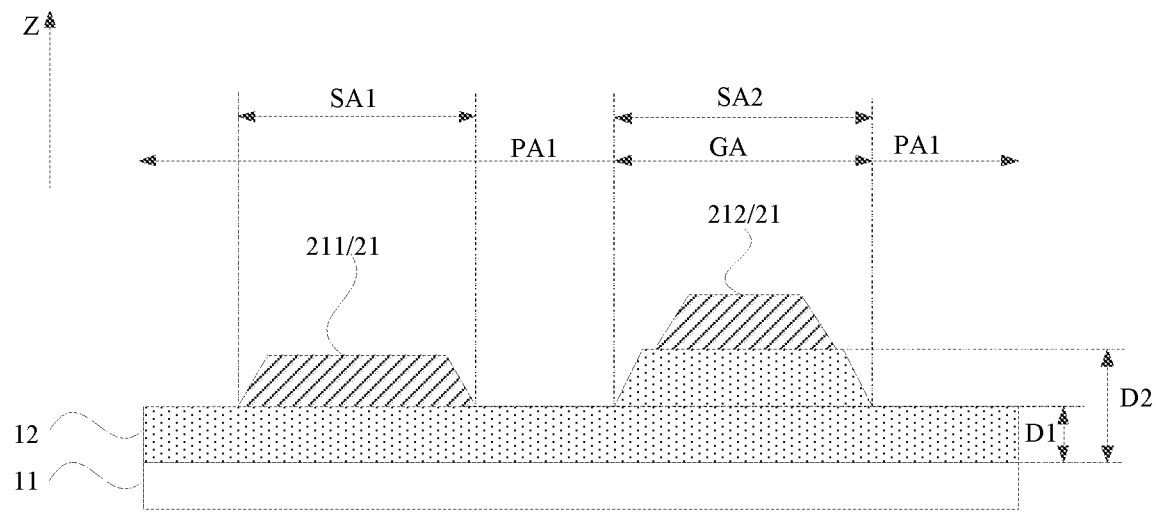
FIG. 2 is a cross-sectional view along direction AA' of FIG. 1.
Figure 3:
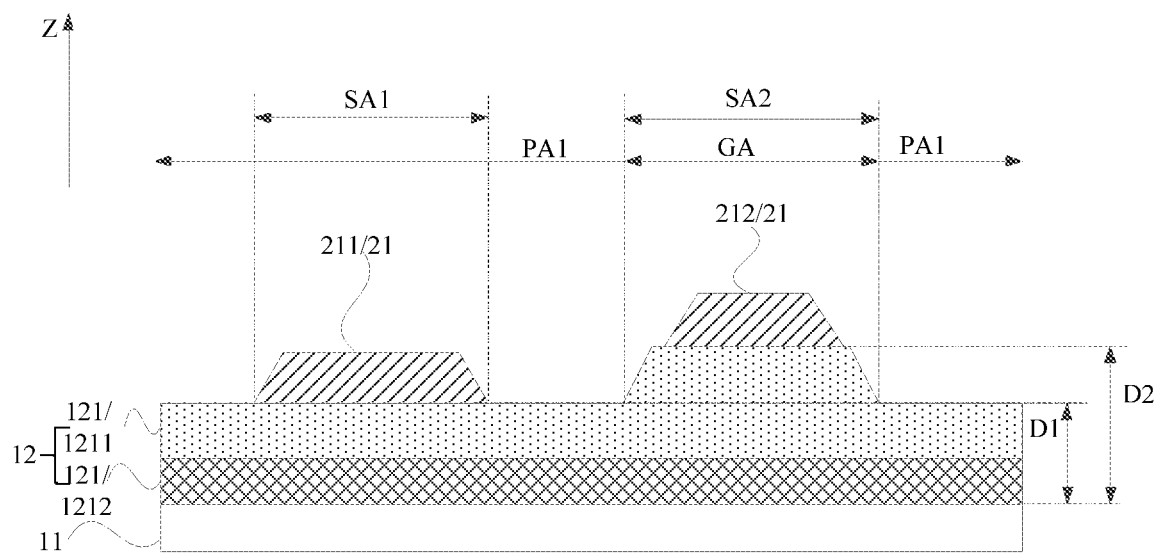
FIG. 3 is another cross-sectional view along direction AA' of FIG. 1.

FIG. 1 is a structure diagram of a display panel according to an embodiment of the present disclosure. FIG. 2 is a cross-sectional view along direction AA' of FIG. 1. FIG. 3 is another cross-sectional view along direction AA' of FIG. 1. With reference to FIGS. 1 to 3, the display panel includes a base substrate 11; and a first signal line 211 and a second signal line 212 that are located on a side of the base substrate 11. Both the first signal line 211 and the second signal line 212 are located in a first metal layer 21 and extend along a first direction Y. The distance between at least part of a surface of the first signal line 211 facing the base substrate 11 and the plane where the base substrate 11 is located is D1, and the distance between at least part of a surface of the second signal line 212 facing the base substrate 11 and the plane where the base substrate 11 is located is D2, where D1≠D2.

The display panel includes an organic light emitting display panel or other display panel known to those skilled in the art, which is not limited herein.

In an embodiment, the display panel may include a display region DA and a non-display region NDA. The display region DA may include multiple pixels P, multiple first signal lines 211, and multiple second signal lines 212. Each pixel P includes a pixel circuit and a light-emitting element. The first signal lines 211 and the second signal lines 212 each are electrically connected with the pixel circuits and supply drive signals to the pixel circuits so that the pixel circuits drive the light-emitting elements to emit light, thereby achieving the effect of displaying a to-be-displayed picture. The non-display region NDA does not have the function of displaying, so a driver circuit and a drive chip may be disposed in the non-display region NDA.

In an embodiment, the first signal lines 211 and the second signal lines 212 each are located in the first metal layer 21. That is, the first signal lines 211 and the second signal lines 212 are prepared with the same material and by the same process. It is to be understood that compared with the arrangement of the first signal lines 211 and the second signal lines 212 in different layers, the arrangement of the first signal lines 211 and the second signal lines 212 in the same layer facilitates the simplification of the preparation process, thereby reducing the number of film layers of the display panel and achieving the thinning of the display panel.

The specific signals transmitted on the first signal lines 211 and the second signal lines 212 may be set by those skilled in the art according to the actual situation, which is not limited herein. In an embodiment, signals transmitted on at least one of the first signal lines 211 or the second signal lines 212 vary with time. In an embodiment, the first signal lines 211 and the second signal lines 212 are one of the first power signal lines and the data signal lines, respectively.

In an embodiment, which one of first signal lines 211 faces the surface of the base substrate 11 has a part located at a distance D1 from the plane of the base substrate 11, which one of second signal lines 212 faces the surface of the base substrate 11 has a part located at a distance D2 from the plane of the base substrate 11, the distance between which part of the surface of the first signal line 211 facing the base substrate 11 and the plane of the base substrate 11 is D1 and the distance between which part of the surface of the second signal line 212 facing the base substrate 11 and the plane of the base substrate 11 is D2 may be set by those skilled in the art according to the actual situation, which is not limited herein. In an embodiment, the display panel includes multiple first signal lines 211 and multiple second signal lines 212. Part of the surface of at least one of the first signal lines 211 facing the base substrate 11 may be set to be at a distance D1 from the plane where the base substrate 11 is located, and part of the surface of at least one of the second signal lines 212 facing the base substrate 11 may be set to be at a distance D2 from the plane where the base substrate 11 is located. That is, at least one of the first signal lines 211 and at least one of the second signal lines 212 are set to be located in the same metal layer and in different horizontal planes. For the first signal line 211 and the second signal line 212 which are not in the same horizontal plane, part of the first signal line 211 may be set to be dislocated from the second signal line 212, or the entire first signal line 211 may be set to be dislocated from the second signal line 212, which is not limited herein and may be set by those skilled in the art according to the actual situation. In an embodiment, the part of the surface of each of the first signal lines 211 facing the base substrate 11, which is at a distance D1 from the plane where the base substrate 11 is located, has the same area, and the part of the surface of each of the second signal lines 212 facing the base substrate 11, which is at a distance D2 from the plane where the base substrate 11 is located, has the same area. In this way, the distribution of the first signal lines 211 and the second signal lines 212 on the display panel can be ensured to be uniform, thereby facilitating the improvement of uniformity. In an embodiment, the part of the surface of at least one of the first signal lines 211 facing the base substrate 11 is at a distance D1 from the plane where the base substrate 11 is located, the part of the surface of at least one of the first signal lines 211 facing the base substrate 11 is not at a distance D1 from the plane where the base substrate 11 is located, and the resistance values of the two first signal lines 211 are the same. In this way, the distribution of the first signal lines 211 on the display panel can be ensured to be uniform, thereby facilitating the improvement of uniformity. In an embodiment, the part of the surface of at least one of the second signal lines 212 facing the base substrate 11 is at a distance D2 from the plane where the base substrate 11 is located, the part of the surface of at least one of the second signal lines 212 facing the base substrate 11 is not at a distance D2 from the plane where the base substrate 11 is located, and the resistance values of the two second signal lines 212 are the same. In this way, the distribution of the second signal lines 212 on the display panel can be ensured to be uniform, thereby facilitating the improvement of uniformity.

The specific value of D1 and the specific value of D2 may be set by those skilled in the art according to the actual situation, which is not limited herein. It is to be noted that the difference between D1 and D2 is not caused by process errors, but exists due to the special design. For example, 2000 A<|D1−D2|<5000 A.

It is to be understood that when the horizontal spacing between the first signal line 211 and the second signal line 212 is constant, different from the arrangement in which the first signal line 211 and the second signal line 211 are located in the same metal layer and in the same horizontal plane (regardless of process errors), in the present application, D1 is set to be not equal to D2 so that along the direction Z perpendicular to the plane where the base substrate is located, at least part of the first signal line 211 and at least part of the second signal line 212 are dislocated from each other and are not in the same horizontal plane. In this way, the space distance between the dislocated part of the first signal line 211 and the dislocated part of the second signal line 212 can be increased, thereby reducing the lateral coupling capacitance between the first signal line 211 and the second signal line 212, improving the problem of signal crosstalk caused by the lateral coupling capacitance, and further improving the display quality of the display panel. As used herein, the horizontal spacing between the first signal line 211 and the second signal line 212 refers to the minimum spacing between the orthographic projection of the first signal line 211 on the base substrate 11 and the orthographic projection of the second signal line 212 on the base substrate 11.

In the display panel provided in the embodiment of the present disclosure, both the first signal line 211 and the second signal line 212 are located in the first metal layer 21, the distance between at least part of the surface of the first signal line 211 facing the base substrate 11 and the plane where the base substrate 11 is located is D1, and the distance between at least part of the surface of the second signal line 212 facing the base substrate 11 and the plane where the base substrate 11 is located is D2, where D1≠D2. That is, along the direction Z perpendicular to the plane where the base substrate 11 is located, at least part of the first signal line 211 and at least part of the second signal line 212 are dislocated from each other and not at the same height so that the space distance between the first signal line and the second signal line that are dislocated from each other increases. In this way, the coupling capacitance between the first signal line 211 and the second signal line 212 can be reduced, the problem of signal crosstalk can be improved, and the purpose of improving the display effect can be achieved.

With continued reference to FIG. 2, optionally, the display panel further includes a first insulating layer 12. The first insulating layer 12 is located on a side of the first metal layer 21 facing the base substrate 11. The display panel includes a first signal line setting region SA1 and a second signal line setting region SA2. Along a direction perpendicular to the plane where the base substrate 11 is located, the first signal line 21 is located in the first signal line setting region SA1, and the second signal line 212 is located in the second signal line setting region SA2. Along the direction Z perpendicular to the plane where the base substrate is located, the thickness of the first insulating layer 12 at least partially located in the first signal line setting region SA1 is different from the thickness of the first insulating layer 12 at least partially located in the second signal line setting region SA2.

In an embodiment, when there is no other conductive film layer between the first metal layer 21 and the base substrate 11, the first insulating layer 12 refers to an insulating layer between the first metal layer 21 and the base substrate 11; and when there are other conductive film layers between the first metal layer 21 and the base substrate 11, the first insulating layer 12 refers to an insulating layer between the first metal layer 21 and a conductive film layer closest to the first metal layer 21. The first insulating layer 12 acts as an insulator and a carrier of the first metal layer 21. The material and thickness of the first insulating layer 12 may be set by those skilled in the art according to the actual situation, which is not limited herein.

The specific preparation method of the first insulating layer 12 may be set by those skilled in the art according to the actual situation, which is not limited herein, as long as the thickness of the first insulating layer 12 at least partially located in the first signal line setting region SA1 is different from the thickness of the first insulating layer 12 at least partially located in the second signal line setting region SA2 along the direction Z perpendicular to the plane where the base substrate is located.

In an embodiment, the first insulating layer 12 is prepared with the same material and by the same preparation process, as shown in FIG. 2. Specifically, the preparation process of the first insulating layer 12 includes the steps described below. In step S111, a first insulating layer material is deposited on the whole surface, where the thickness of the first insulating layer material deposited in each region of the display panel is the same (regardless of process errors). In step S112, the first insulating layer 12 is patterned so that the thickness of the first insulating layer 12 at least partially located in the first signal line setting region SA1 is different from the thickness of the first insulating layer 12 at least partially located in the second signal line setting region SA2. It is to be noted that the difference between the thickness of the first insulating layer 12 at least partially located in the first signal line setting region SA1 and the thickness of the first insulating layer 12 at least partially located in the second signal line setting region SA2 is not caused by process errors, but exists due to the special design. In an embodiment, the thickness difference may be greater than 2000 A and less than 5000 A. It is to be understood that when the first insulating layer 12 is prepared with the same material and by the same preparation process, the preparation process of the first insulating layer 12 can be simplified, which facilitates the improvement of the production efficiency of the display panel and the reduction of the cost.

In an embodiment, the first insulating layer 12 includes at least two first insulating sub-layers 121, as shown in FIG. 3. The material of each of the first insulating sub-layers 121 may be the same or may be different, which is not limited herein. In an embodiment, the preparation process of each of the first insulating sub-layers 121 includes the step described below. In step S121, a material of the first insulating sub-layer 121 is deposited on the whole surface, where the thickness of the material of the first insulating sub-layer 121 deposited in each region of the display panel is the same (regardless of process errors). The preparation process of at least one of the first insulating sub-layers 121 includes the step described below. In step S112, the first insulating sub-layer 121 is patterned so that the thickness of the first insulating sub-layer 121 at least partially located in the first signal line setting region SA1 is different from the thickness of the first insulating sub-layer 121 at least partially located in the second signal line setting region SA2. Similarly, the thickness difference is not caused by process errors, but exists due to the special design.

It is to be noted that the specific implementation modes of the "patterning" of the first insulating layer 12 prepared with the same material and by the same preparation process and the "patterning" of the first insulating sub-layer may be set by those skilled in the art according to the actual situation, which is not limited herein. The above will be described below by using typical examples and thus will not be repeated herein.

It is to be understood that the thickness of the first insulating layer 12 at least partially located in the first signal line setting region SA1 is set to be different from the thickness of the first insulating layer 12 at least partially located in the second signal line setting region SA2 so that for the distance D1 between the surface, away from the base substrate 11, of the first insulating layer 12 located at least partially in the first signal line setting region SA1 and the plane where the base substrate 11 is located and the distance D2 between the surface, away from the base substrate 11, of the first insulating layer 12 located at least partially in the second signal line setting region SA2 and the plane where the base substrate 11 is located, D1 is not equal to D2. In this way, the following effects can be achieved: the distance D1 between at least part of the surface of the first signal line 211 facing the base substrate 11 and the plane where the base substrate 11 is located is not equal to the distance D2 between at least part of the surface of the second signal line 212 facing the base substrate 11 and the plane where the base substrate 11 is located.

Figure 4:
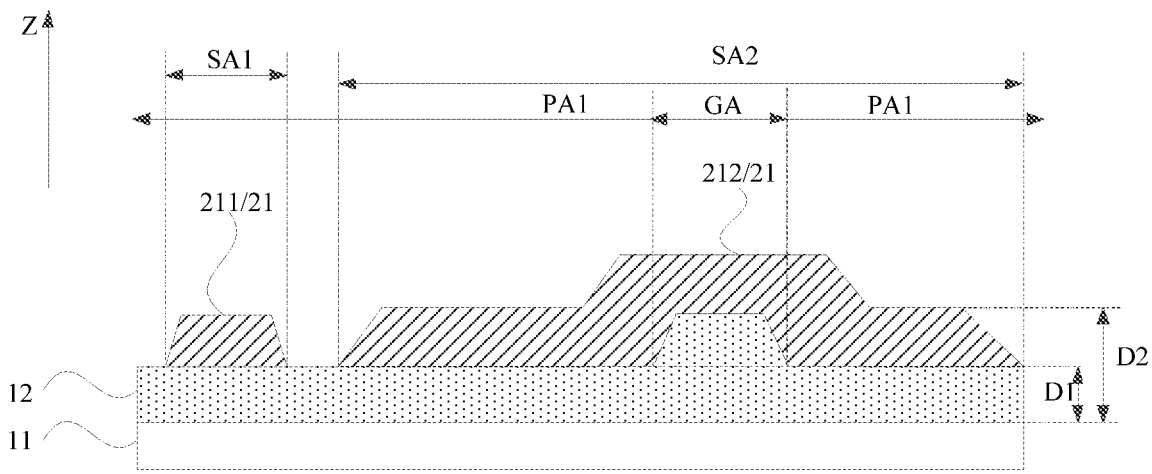
FIG. 4 is a cross-sectional view along direction BB' of FIG. 1.
Figure 5:
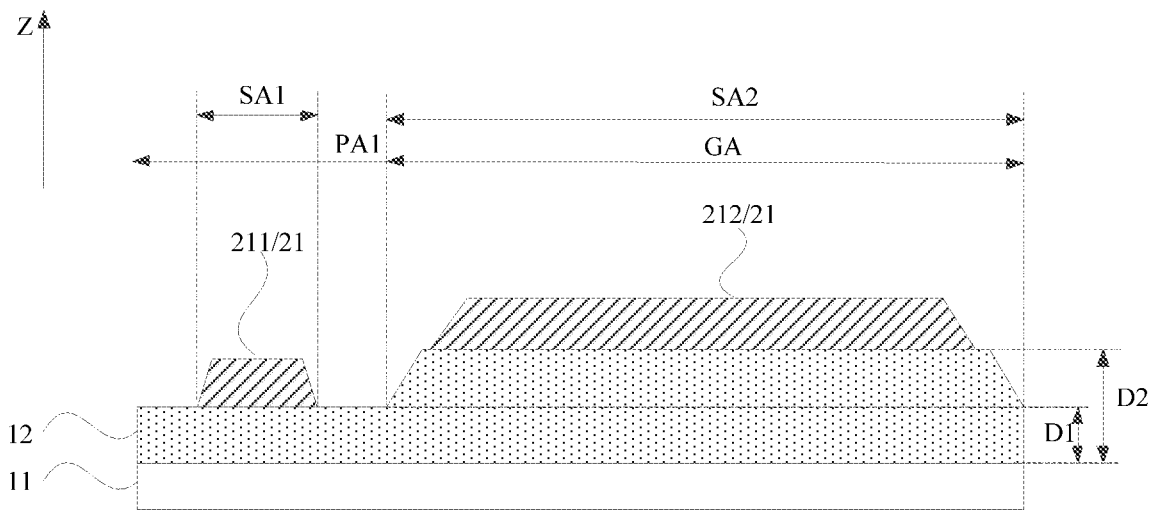
FIG. 5 is another cross-sectional view along direction BB' of FIG. 1.

FIG. 4 is a cross-sectional view along direction BB' of FIG. 1. FIG. 5 is another cross-sectional view along direction BB' of FIG. 1. With continued reference to FIGS. 2 to 5, optionally, the first insulating layer 12 further includes a first planar region PA1, the second signal line setting region SA2 includes a pad region GA, and along the direction perpendicular to the plane where the base substrate 11 is located, the thickness of the first insulating layer 12 located in the pad region GA is greater than the thickness of the first insulating layer 12 located in the first planar region PA1.

In an embodiment, each of second signal line setting regions SA2 may be set to include a pad region GA, or a partial number of second signal line setting regions SA2 may be set to include a pad region GA, which is not limited herein.

In an embodiment, in the preparation process of the first insulating layer 12, through the patterning process, the first insulating layer 12 in the first planar region PA1 is thinned while the first insulating layer 12 in the pad region GA is not thinned or thinned to a small extent so that the thickness of the first insulating layer 12 in the first planar region PA1 is less than the thickness of the first insulating layer 12 in the pad region GA. When the first insulating layer 12 in the pad region GA and the first insulating layer 12 in the first planar region PA1 each are thinned, the first insulating layer 12 may be patterned by half-masking.

Figure 14:
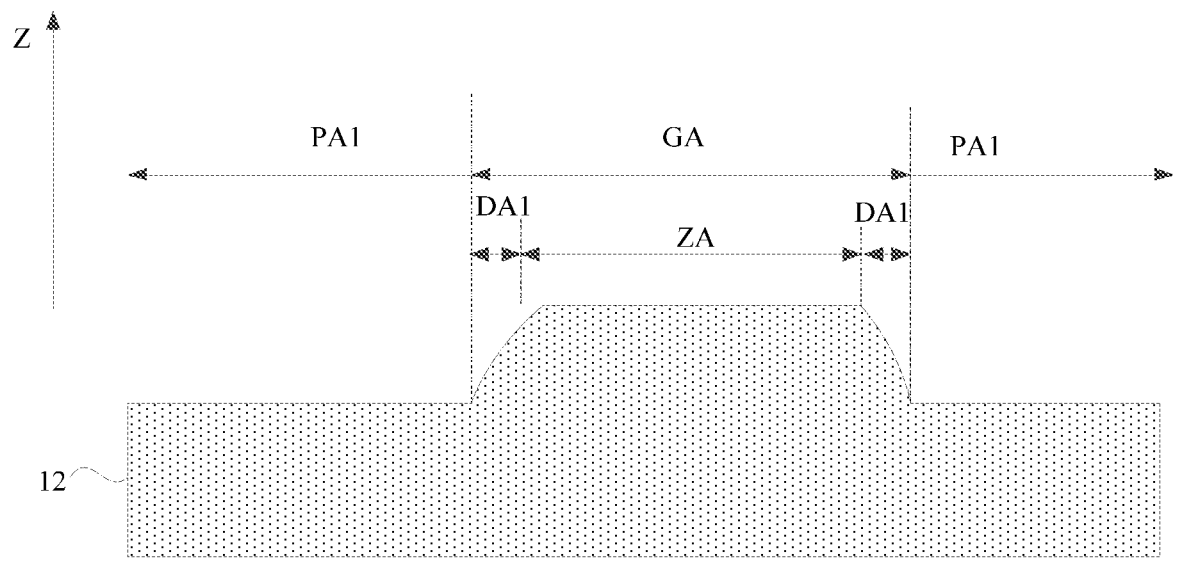
FIG. 14 is a structure diagram of another first insulating layer according to an embodiment of the present disclosure.

In an embodiment, along the direction Z perpendicular to the plane where the base substrate is located, the first signal line setting region SA1 may at least partially overlap the first planar region PA1 (as shown in FIGS. 3 to 5), and the first signal line setting region SA1 may also at least partially overlap an region of the first insulating layer 12, whose thickness is less than the thickness of the first insulating layer 12 located in the first planar region PA1 (as shown in FIG. 14 later), which is not limited herein, as long as the purpose of at least partially raising the second signal line 212 with respect to the first signal line 211 can be achieved. In this way, the space distance between at least part of the first signal line 211 and at least part of the second signal line 212 can be increased, the problem of signal crosstalk between the first signal line 211 and the second signal line 212 can be improved, and the display effect of the display panel can be improved.

In an embodiment, the first signal line 211 may include a power signal line and the second signal line 212 may include a data signal line such that the data signal line may be at least partially raised with respect to the power signal line. The first signal line 211 may also include a data signal line and the second signal line 212 may include a power signal line such that the power signal line may be at least partially raised with respect to the data signal line. The space distance between the power signal line and the data signal line can be increased regardless of whether the power signal line or the data signal line is raised, thereby improving the crosstalk problem between the power signal line and the data signal line.

It is to be noted that the overlapping degree of the second signal line setting region SA2 and the pad region GA along the direction Z perpendicular to the plane where the base substrate is located may be set by those skilled in the art according to the actual situation, which is not limited herein. It is to be understood that the greater the overlapping degree of the second signal line setting region SA2 and the pad region GA, the greater the space distance between the first signal line 211 and the second signal line 212, and the more favorable it is to improve the crosstalk problem.

It is also to be noted that the "first planar region PA1" described herein and the "second planar region PA2" and the "fourth planar region PA4" described below all refer to planar regions located on the first insulating layer 12, and the "first", "second", and "fourth" are used only to distinguish planar regions obtained by different patterning processes, and their representative meanings are the same. The "first planar region PA1", the "second planar region PA2", and the "fourth planar region PA4" each refer to regions where no pad or groove treatment is performed on the first insulating layer 12 and which do not overlap the first signal line setting region SA1 and the second signal line setting region SA2 in the direction perpendicular to the plane where the base substrate is located. The "first planar region PA1", the "second planar region PA2", and the "fourth planar region PA4" serve as a reference, the "first planar region PA1" and the "fourth planar region PA1" are the reference of the raising of the pad region GA, and the "second planar region PA2" and the "fourth planar region PA4" are the reference of the depression of the first groove region described later.

With continued reference to FIG. 5, in an embodiment, along a direction perpendicular to the base substrate 11, the second signal line 212 is located in the pad region GA.

In an embodiment, the second signal line 212 is located in the pad region GA, that is, the entire second signal line 212 is raised. In this way, when the allowable crosstalk degree between the first signal line 211 and the second signal line 212 is constant, compared with the arrangement in which the first signal line 211 and the second signal line 212 are on the same horizontal plane, in the present application, the first signal line 211 and the second signal line 212 are disposed on different horizontal planes by raising the second signal line 212 so that there may be not only horizontal spacing but also vertical spacing in the direction perpendicular to the base substrate 1 between the first signal line 211 and the second signal line 212. In this way, the horizontal spacing between the first signal line 211 and the second signal line 212 can be reduced, and the line width of at least one of the first signal line 211 and the second signal line 212 can be increased, thereby facilitating the reduction of the loss when the signal is transmitted on the signal line.

In an embodiment, when one of the first signal line 211 and the second signal line 212 includes a power signal line and the line width of the power signal line is increased, the IR drop on the power signal line can be reduced, thereby improving the uniformity of the display panel.

Figure 6:
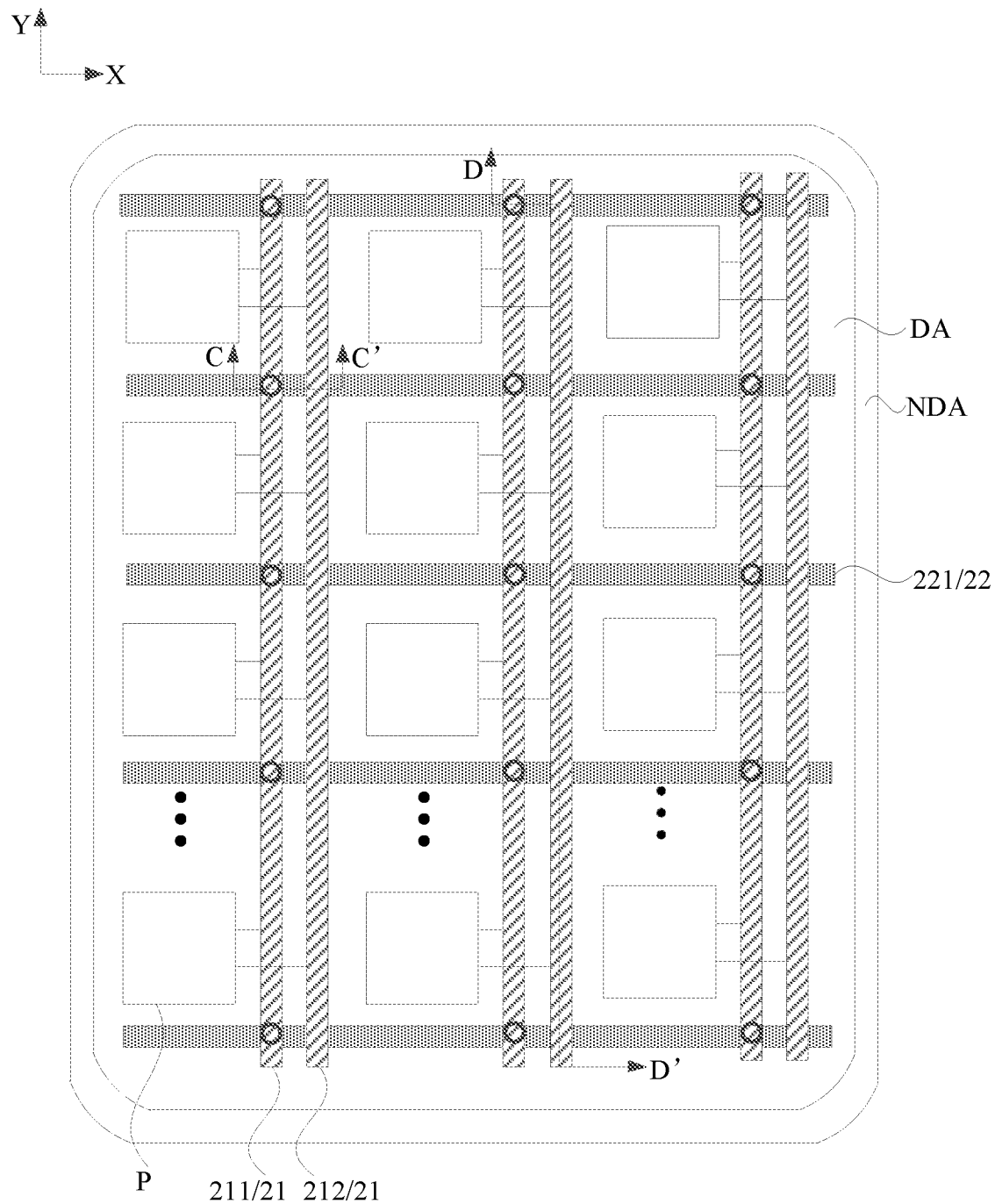
FIG. 6 is a structure diagram of a display panel according to another embodiment of the present disclosure.
Figure 7:
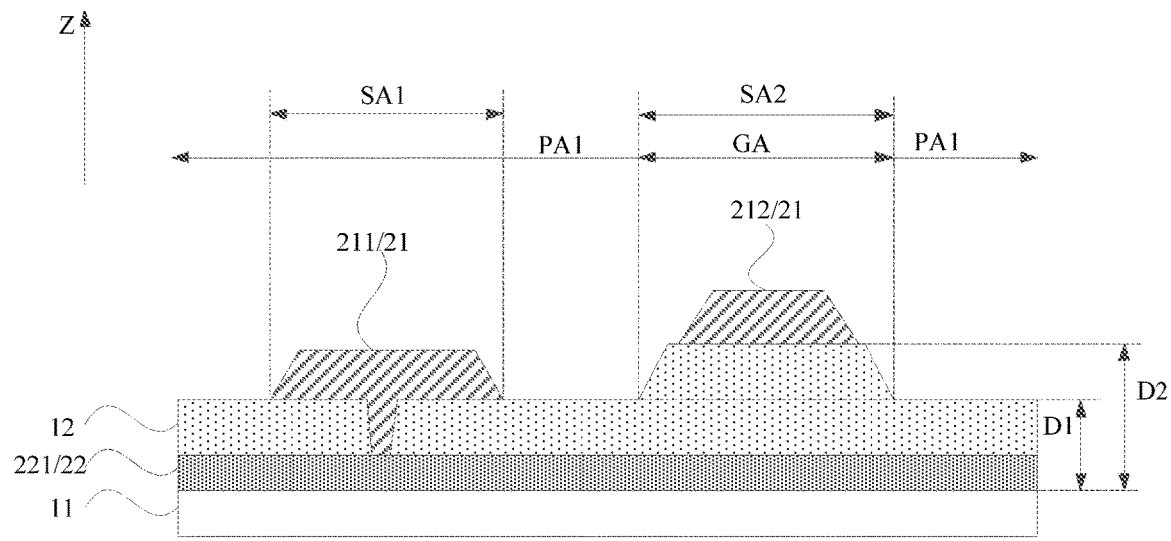
FIG. 7 is a cross-sectional view along direction CC' of FIG. 6.
Figure 8:
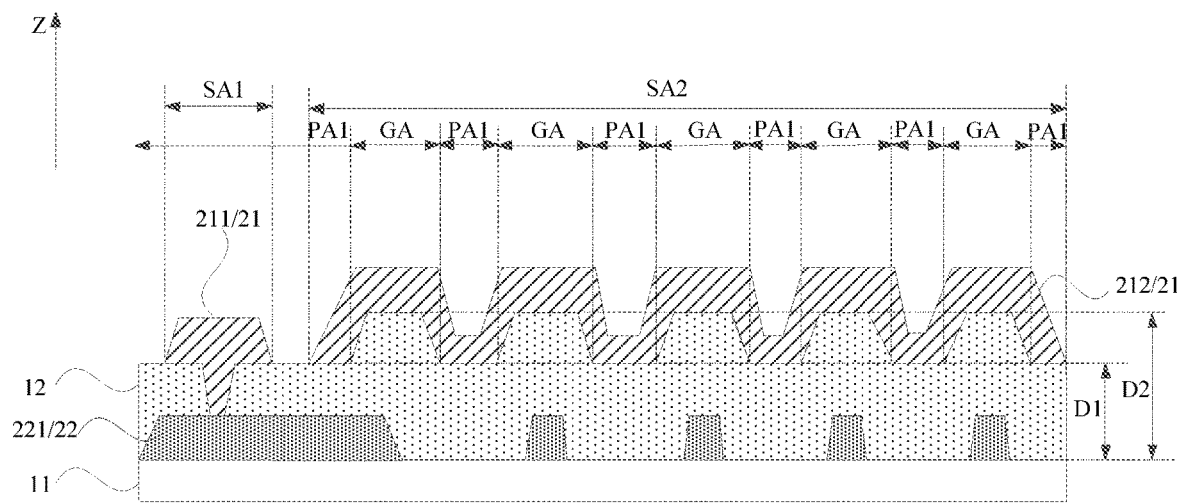
FIG. 8 is a cross-sectional view along direction DD' of FIG. 6.
Figure 9:
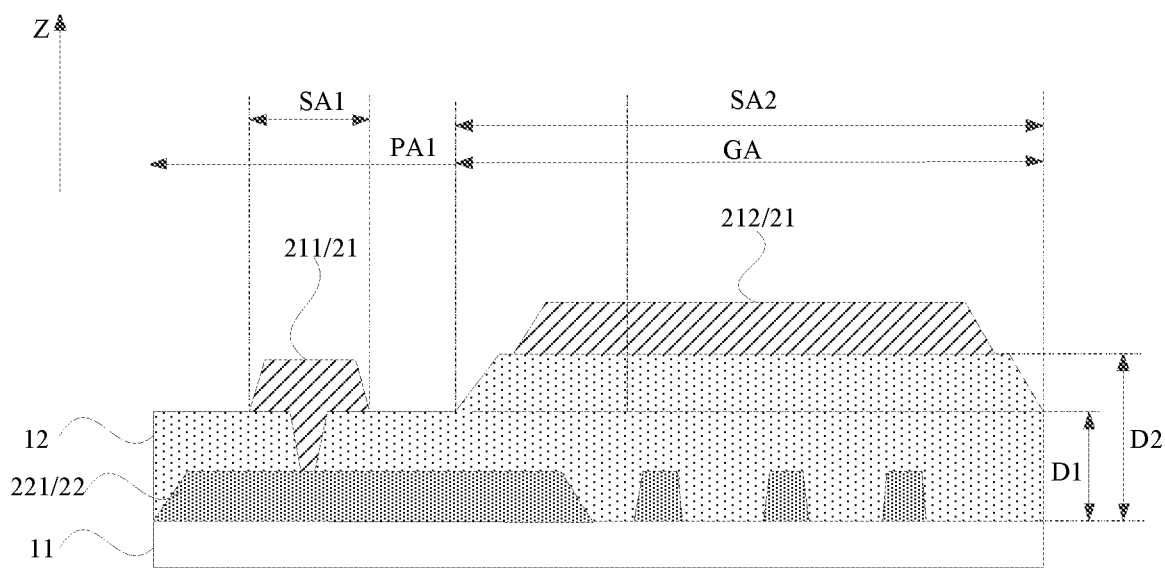
FIG. 9 is another cross-sectional view along direction DD' of FIG. 6.
Figure 10:
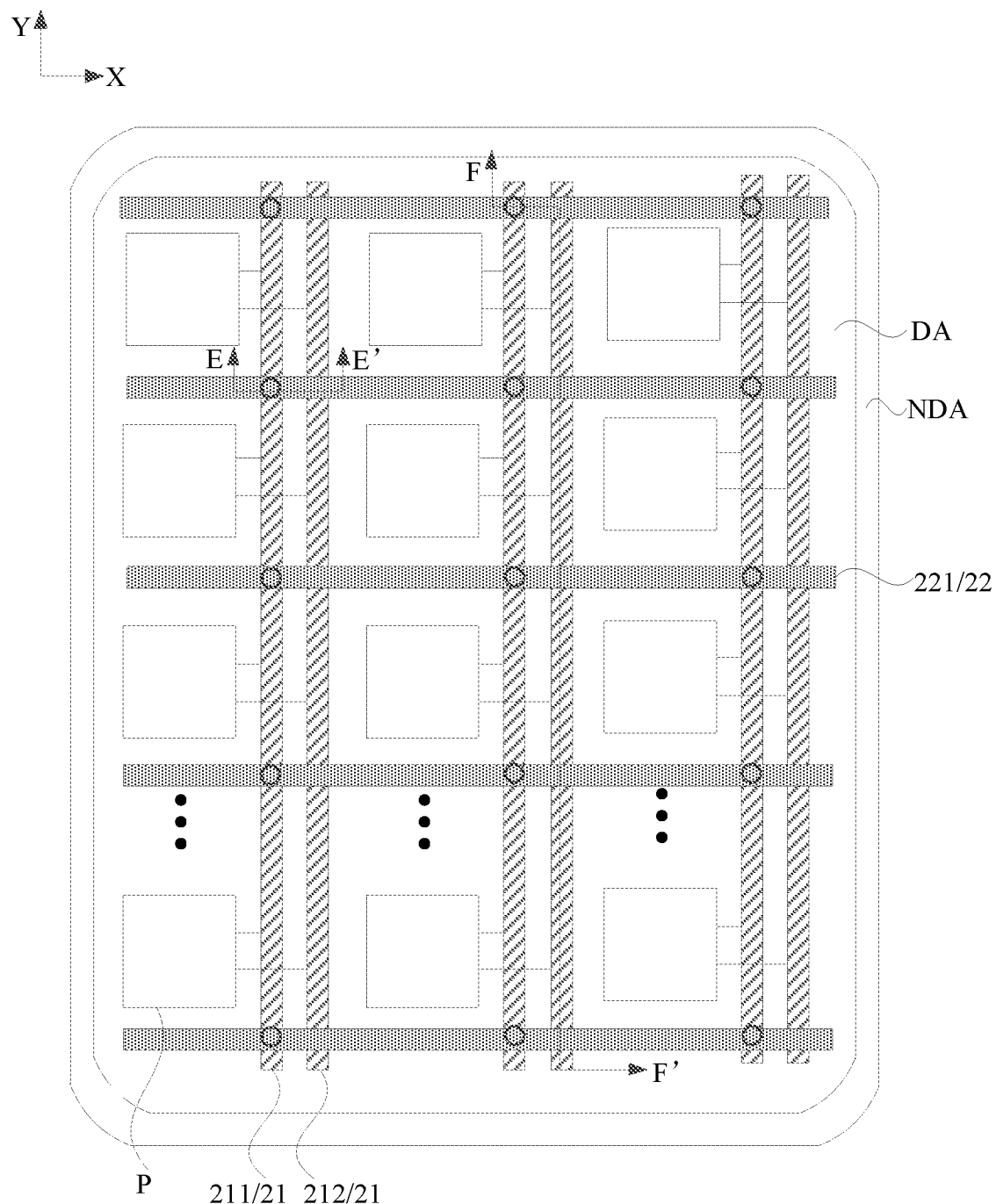
FIG. 10 is a structure diagram of a display panel according to another embodiment of the present disclosure.
Figure 11:
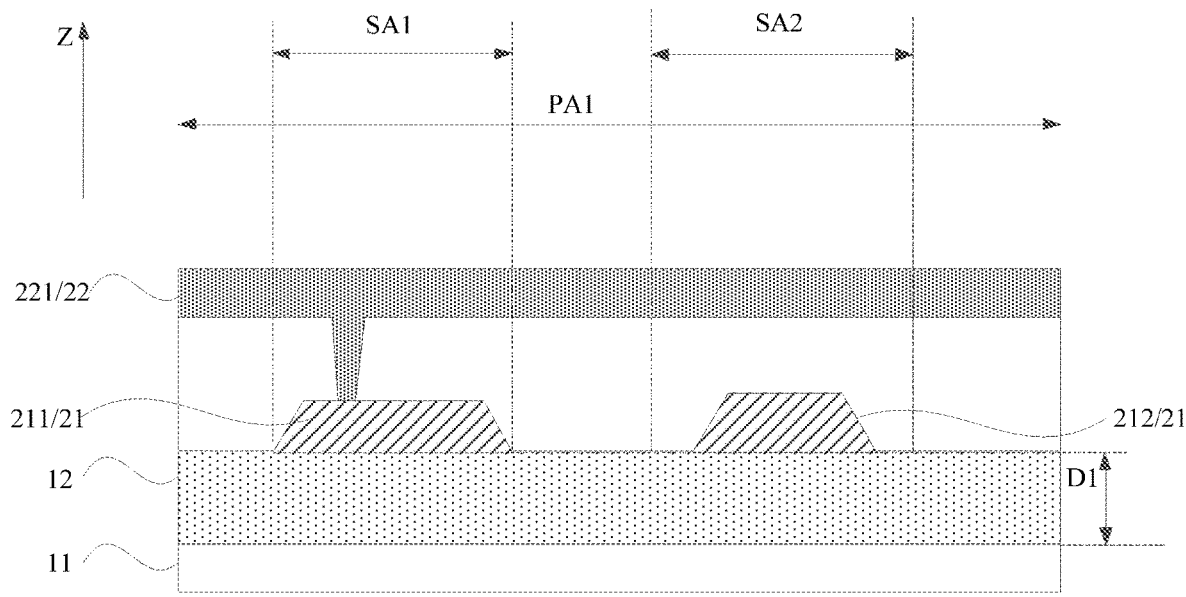
FIG. 11 is a cross-sectional view along direction EE' of FIG. 10.
Figure 12:
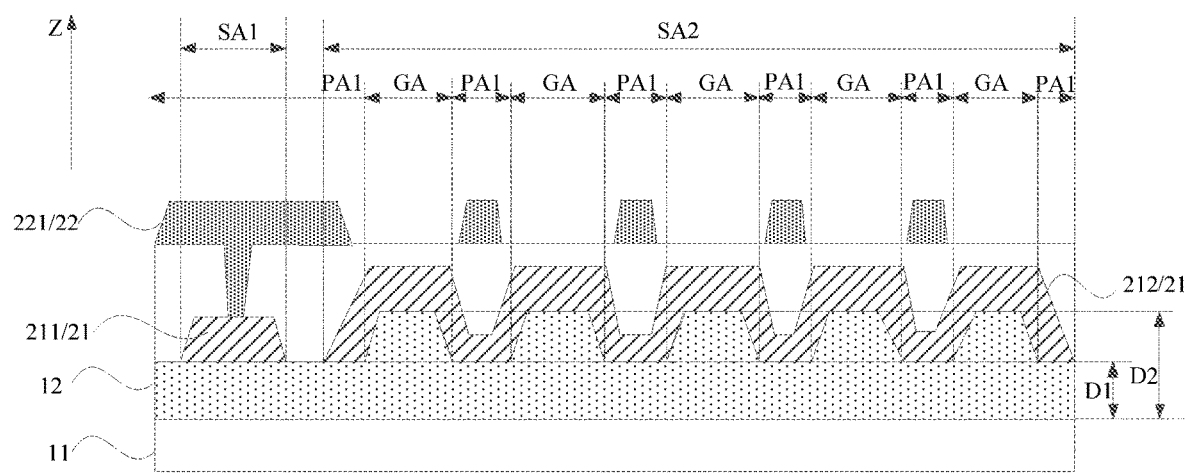
FIG. 12 is a cross-sectional view along direction FF' of FIG. 10.

FIG. 6 is a structure diagram of a display panel according to another embodiment of the present disclosure. FIG. 7 is a cross-sectional view along direction CC' of FIG. 6. FIG. 8 is a cross-sectional view along direction DD' of FIG. 6. FIG. 9 is another cross-sectional view along direction DD' of FIG. 6. FIG. 10 is a structure diagram of a display panel according to another embodiment of the present disclosure. FIG. 11 is a cross-sectional view along direction EE' of FIG. 10. FIG. 12 is a cross-sectional view along direction FF' of FIG. 10. The location of the second metal layer 22 in the cross-sectional views shown in FIGS. 7 to 8 is different from the location of the second metal layer 22 in the cross-sectional views shown in FIGS. 10 to 12. With reference to FIGS. 6-12, in an embodiment, the display panel further includes a third signal line 221. The third signal line 221 is electrically connected with the first signal line 211, and the third signal line 221 is located in a second metal layer 22 and extends along a second direction X, where the first direction Y and the second direction X cross. Along the direction perpendicular to the plane where the base substrate 11 is located, the third signal line 221 at least partially overlaps the pad region GA.

In an embodiment, the second metal layer 22 may be located on a side of the first metal layer 21 facing the base substrate 11 (as shown in FIGS. 7 to 9), and the second metal layer 22 may also be located on a side of the first metal layer 21 away from the base substrate 11 (as shown in FIGS. 10 to 12), which is not limited herein. The first signal line 211 and the third signal line 221 may be electrically connected with each other through a via, and both transmit the same signal. In this way, the first signal line 211 extending along the first direction Y and the third signal line 221 extending along the second direction X cross to form the grid shape and are uniformly distributed in the display panel, thereby facilitating the uniformity of signals transmitted on the first signal line 211 and the third signal line 221, reducing the voltage drop of the first signal line 211 and the third signal line 221, and further improving the display effect. In an embodiment, the first signal line 211 and the third signal line 221 include power signal lines, and the first signal line 211 and the third signal line 221 cross to form the grid shape and are uniformly distributed in the display panel, thereby facilitating the uniformity of the power signal, reducing the voltage drop of the power signal line, and further improving the display uniformity.

The third signal line 221 and the first signal line 211 are electrically connected through a via. The solid circle in the location where the third signal line 221 overlaps the first signal line 211 in FIG. 6 indicates the connection via between the third signal line 221 and the first signal line 211. The solid circle herein only illustrates the location of the via and does not represent the size of the via. The specific size of the via depends on the specific display panel design. With the same logic, the solid circles in FIGS. 10 and 15 have the same meaning as the solid circles in FIG. 6, which will not be repeated herein.

When the second metal layer 22 is located on a side of the first metal layer 21 facing the base substrate 11 (as shown in FIGS. 7 to 9), the third signal line 221 is set to at least partially overlap the pad region GA so that the distance between the second signal line 212 and the third signal line 221 in the pad region GA along the direction Z perpendicular to the plane where the base substrate is located can be increased and thus the capacitance formed between the second signal line 212 and the third signal line 221 can be reduced, thereby facilitating the improvement of the crosstalk problem. It is to be noted that the overlapping degree of the setting region of the third signal line 221 and the pad region GA along the direction Z perpendicular to the plane where the base substrate is located may be set by those skilled in the art according to the actual situation, which is not limited herein.

The cross-sectional views of FIGS. 7 and 8 just illustrate the electrical connection between the first signal line 211 and the third signal line 221, and the electrical connection among the first signal line 211, the third signal line 221, and other structures is not illustrated.

When the second metal layer 22 is located on a side of the first metal layer 21 away from the base substrate 11 (as shown in FIGS. 10 to 12), the third signal line 221 may be set to not at least partially overlap the pad region GA so that the distance between the second signal line 212 and the third signal line 221 in the pad region GA along the direction Z perpendicular to the plane where the base substrate is located can be prevented from being decreased and thus the capacitance formed between the second signal line 212 and the third signal line 221 can be prevented from being increased, thereby avoiding the aggravation of the crosstalk problem. It is to be noted that the non-overlapping degree of the setting region of the third signal line 221 and the pad region GA along the direction Z perpendicular to the plane where the base substrate is located may be set by those skilled in the art according to the actual situation, which is not limited herein.

Figure 13:
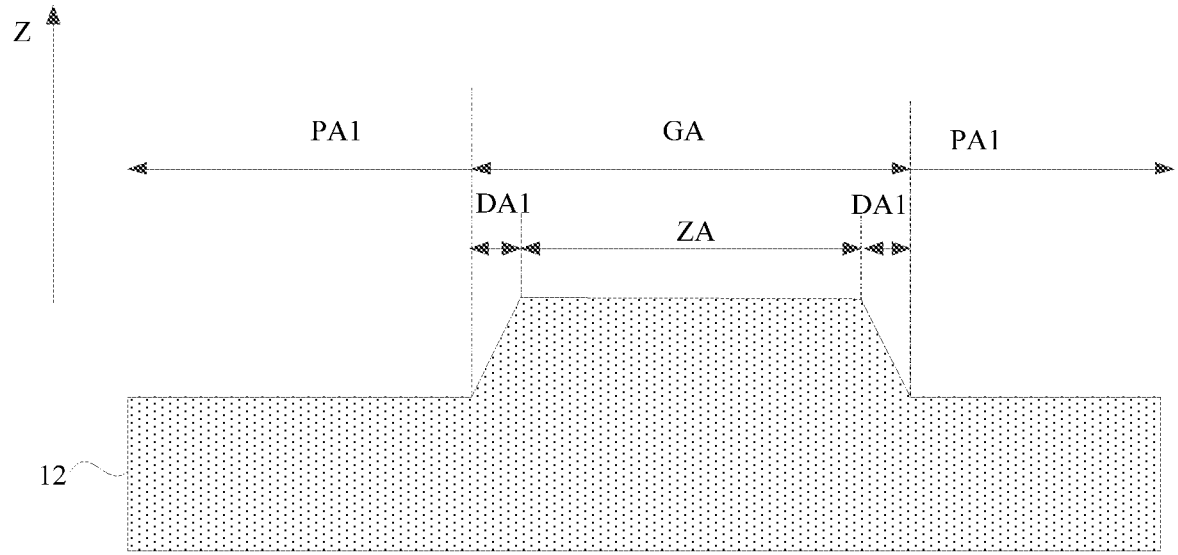
FIG. 13 is a structure diagram of a first insulating layer according to an embodiment of the present disclosure.

FIG. 13 is a structure diagram of a first insulating layer according to an embodiment of the present disclosure. FIG. 14 is a structure diagram of a first insulating layer according to an embodiment of the present disclosure. With reference to FIGS. 13 and 14, in an embodiment, along a direction of the base substrate 11 pointing to the first insulating layer 12, the cross-sectional area of the first insulating layer 12 located in the pad region GA is gradually decreased.

In an embodiment, the cross-sectional area herein refers to the area of the cross section of the first insulating layer 12 in the pad region GA, and the cross section is parallel to the plane where the base substrate 11 is located. The pad region GA includes a first transition region DA1 and a highest region ZA. The first transition region DA1 is located in the first planar region PA1 and the highest region ZA. From the direction from the first planar region PA1 to the highest region ZA, the thickness of the first insulating layer 12 in the first transition region DA1 is gradually increased, and the thickness of the first insulating layer 12 in the whole highest region ZA is the same (regardless of process errors). The shape of the longitudinal section of the first insulating layer 12 in the pad region GA may be set by those skilled in the art according to the actual situation, which is not limited herein, where the longitudinal section is perpendicular to the plane where the base substrate 11 is located. In an embodiment, the longitudinal section of the first insulating layer 12 in the pad region GA may be trapezoidal (as shown in FIGS. 7 to 11) or "trapezoid-like", the waist of the "trapezoid-like" shape may be curved (as shown in FIG. 14) or polygonal (as shown in FIG. 15), and the difference between the upper bottom and the lower bottom of the trapezoid may be set by those skilled in the art according to the actual situation.

The first planar region PA1 is transitioned to the highest region ZA through the first transition region DA1 so that the thickness of the first insulating layer 12 is gradually increased from the first planar region PA1 to the highest region ZA. In this way, a sudden change of the thickness of the first insulating layer 12 can be avoided, thereby preventing the second signal line 212 from breaking at the junction of the first planar region PA1 and the pad region GA.

Figure 15:
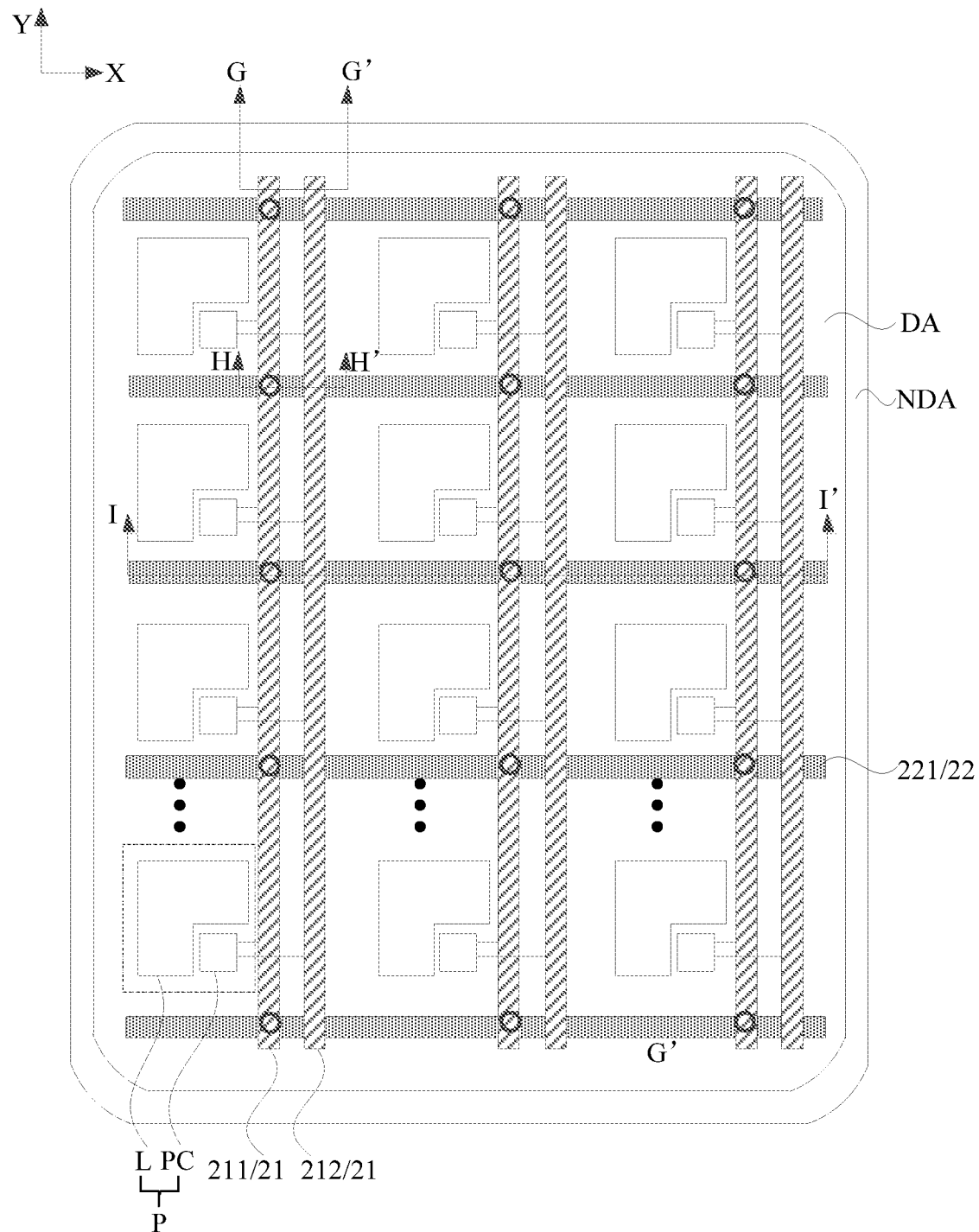
FIG. 15 is a structure diagram of another display panel according to an embodiment of the present disclosure.
Figure 16:
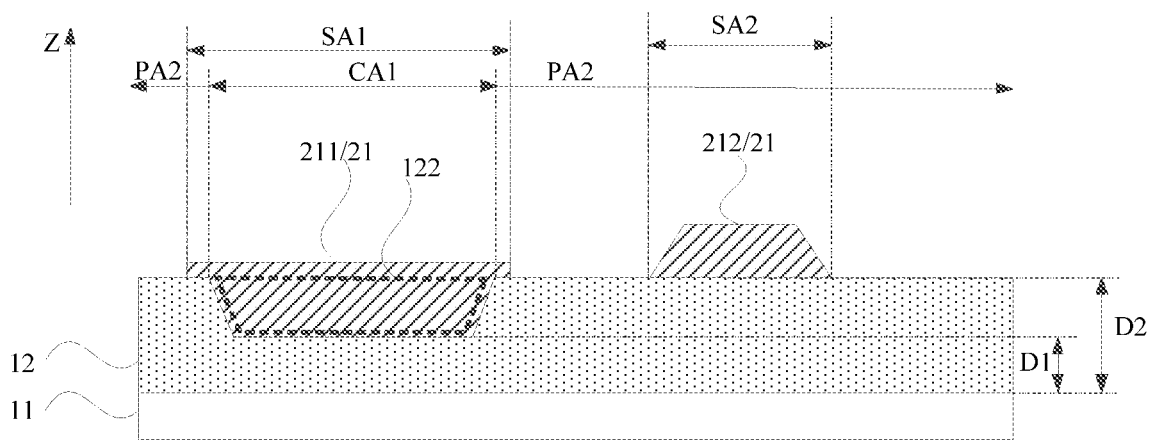
FIG. 16 is a cross-sectional view along direction GG' of FIG. 15.
Figure 17:
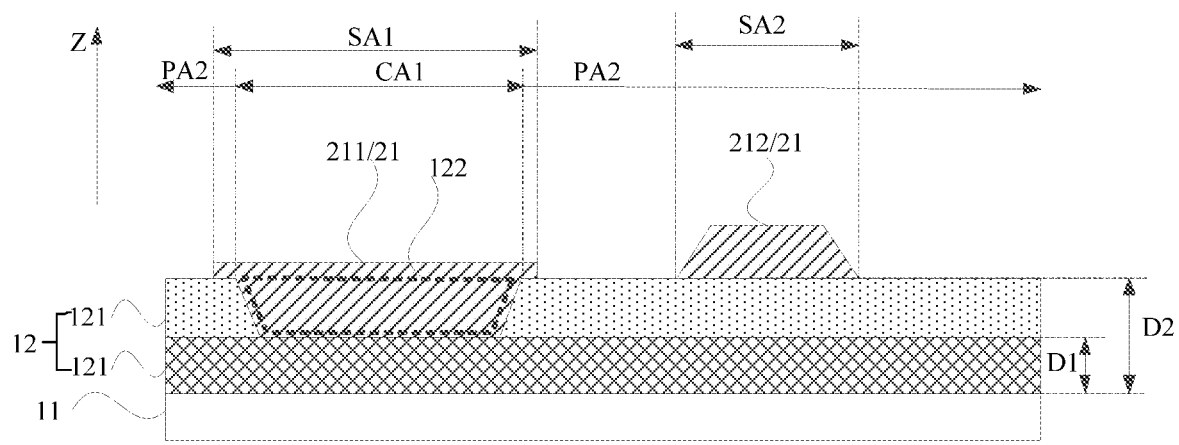
FIG. 17 is another cross-sectional view along direction GG' of FIG. 15.

FIG. 15 is a structure diagram of a display panel according to another embodiment of the present disclosure. FIG. 16 is a cross-sectional view along direction GG' of FIG. 15. FIG. 17 is another cross-sectional view along direction GG' of FIG. 15. With reference to FIGS. 15 to 17, in an embodiment, the first insulating layer 12 further includes a second planar region SA2 and a via region (not shown in figures), and the first signal line setting region SA1 includes a first groove region CA1. Along the direction perpendicular to the plane where the base substrate 11 is located, the thickness of the first insulating layer 12 located in the first groove region CA1 is greater than or equal to the thickness of the first insulating layer 12 located in the via region, and the thickness of the first insulating layer 12 located in the first groove region CA1 is less than the thickness of the first insulating layer 12 located in the second planar region PA2.

In an embodiment, each of first signal line setting regions SA1 may be set to include a first groove region CA1, or a partial number of first signal line setting regions SA1 may be set to include a first groove region CA1, which is not limited herein.

In an embodiment, the thickness of the first insulating layer 12 located in the via region is zero. In an embodiment, the first groove region CA1 is provided with a first groove 122, and the degree to which the first groove 122 penetrates the first insulating layer 12 may be set by those skilled in the art according to the actual situation, which is not limited herein. In an embodiment, the first insulating layer 12 is prepared with the same material and by the same preparation process. The first groove 122 at least partially penetrates the first insulating layer 12 (as shown in FIG. 16), where "at least partially penetrating" means that when the first groove 122 penetrates the first insulating layer 12, the first groove 122 forms a through hole, and when the first groove 122 partially penetrates the first insulating layer 12, the thickness of the first insulating layer 12 in the location where the first groove 122 is located is greater than zero. In an embodiment, the first insulating layer 12 includes at least one first insulating sub-layer 122. The first groove region CA1 includes a first groove 122, and the first groove 122 at least partially penetrates the at least one first insulating sub-layer 121 (as shown in FIG. 17), where for the understanding of the "first insulating sub-layer 121 at least partially penetrating", reference may be made to explanation of the "first insulating layer 12 at least partially penetrating", which is not repeated herein.

In an embodiment, in the preparation process of the first insulating layer 12, through the patterning process, the first insulating layer 12 of the first groove region CA1 is thinned while the first insulating layer 12 of the second planar region PA2 is not thinned or thinned to a small extent so that the thickness of the first insulating layer 12 of the first groove region GA1 is less than the thickness of the first insulating layer 12 of the second planar region PA2. When the first insulating layer 12 of the first groove region CA1 and the first insulating layer 12 of the second planar region PA2 each are thinned, the first insulating layer 12 may be patterned by half-masking so that the first insulating layer 12 of the first groove region CA1 and the first insulating layer 12 of the second planar region PA2 each can be thinned through one single etching process, which facilitates the simplification of the preparation process of the first insulating layer 12, thereby further improving the production efficiency and reducing the cost.

In an embodiment, along the direction Z perpendicular to the plane where the base substrate is located, the second signal line setting region SA2 may at least partially overlap the second planar region PA2 (as shown in FIG. 13), and the second signal line setting region SA2 may also at least partially overlap an region of the first insulating layer 12, whose thickness is greater than the thickness of the first insulating layer 12 located in the second planar region PA2 (as shown in FIG. 14 later), which is not limited herein, as long as the purpose of at least partially sinking the first signal line 211 with respect to the second signal line 212 can be achieved. In this way, the space distance between the first signal line 211 and the second signal line 212 can be increased, the problem of signal crosstalk between the first signal line 211 and the second signal line 212 can be improved, and the display effect of the display panel can be improved.

In an embodiment, the first signal line 211 may include a power signal line and the second signal line 212 may include a data signal line so that the power signal line may be at least partially sunk with respect to the data signal line, thereby increasing the space distance between the power signal line and the data signal line and improving the crosstalk problem between the power signal line and the data signal line.

Figure 18:
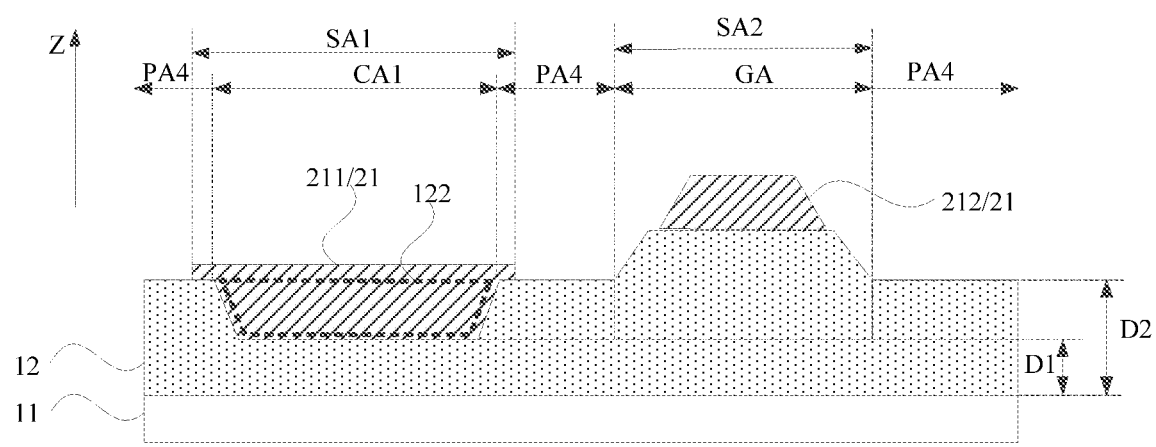
FIG. 18 is another cross-sectional view along direction GG' of FIG. 15.
Figure 19:
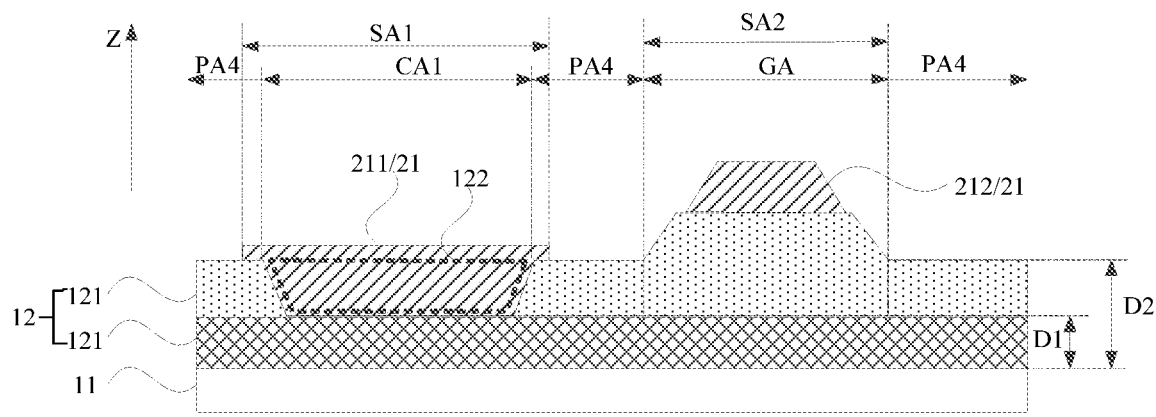
FIG. 19 is another cross-sectional view along direction GG' of FIG. 15.

FIG. 18 is another cross-sectional view along direction GG' of FIG. 15. FIG. 19 is another cross-sectional view along direction GG' of FIG. 15. With continued reference to FIGS. 18 and 19, optionally, the first insulating layer 12 further includes a fourth planar region PA4 and a via region. The second signal line setting region SA2 includes a pad region GA, and the first signal line setting region SA1 includes a first groove region CA1. Along the direction perpendicular to the plane where the base substrate 11 is located, the thickness of the first insulating layer 12 located in the pad region GA is greater than the thickness of the first insulating layer 12 located in the fourth planar region PA4. Along the direction perpendicular to the plane where the base substrate 11 is located, the thickness of the first insulating layer 12 located in the first groove region CA1 and the thickness of the first insulating layer 12 located in the via region each are less than the thickness of the first insulating layer 12 located in the fourth planar region PA4.

In an embodiment, in the preparation process of the first insulating layer 12, through the patterning process, the first insulating layer 12 in the first groove layer CA1 and the first insulating layer 12 in the fourth planar region PA4 each are thinned while the first insulating layer 12 in the pad region GA is not thinned or thinned to a small extent. The thinning degree in the first groove region CA1 is greater than the thinning degree in the fourth planar region PA4, and the thinning degree in the fourth planar region PA4 is greater than the thinning degree in the pad region GA, so that the thickness of the first insulating layer 12 in the first groove region CA1 is less than the thickness of the first insulating layer 12 in the fourth planar region PA4, and the thickness of the first insulating layer 12 in the fourth planar region PA4 is less than the thickness of the first insulating layer 12 in the pad region GA.

In an embodiment, when the first insulating layer 12 is prepared with the same material and by the same preparation process, the first insulating layer 12 may be patterned by half-masking so that through one single etching process, a protrusion is formed in the pad region GA of the first insulating layer 12 while a groove is formed in the first groove region CA1 of the first insulating layer 12, which facilitates the simplification of the preparation process of the display panel. Similarly, when the first insulating layer 12 includes at least two first insulating sub-layers 121, the two first insulating sub-layers 121 may be patterned by half-masking.

It is understood that at least part of the first signal line 211 is raised while at least part of the second signal line 212 is sunk so that the space distance between the first signal line 211 and the second signal line 212 can be further increased, thereby further improving the problem of signal crosstalk between the first signal line 211 and the second signal line 212 and improving the display effect of the display panel.

Figure 20:
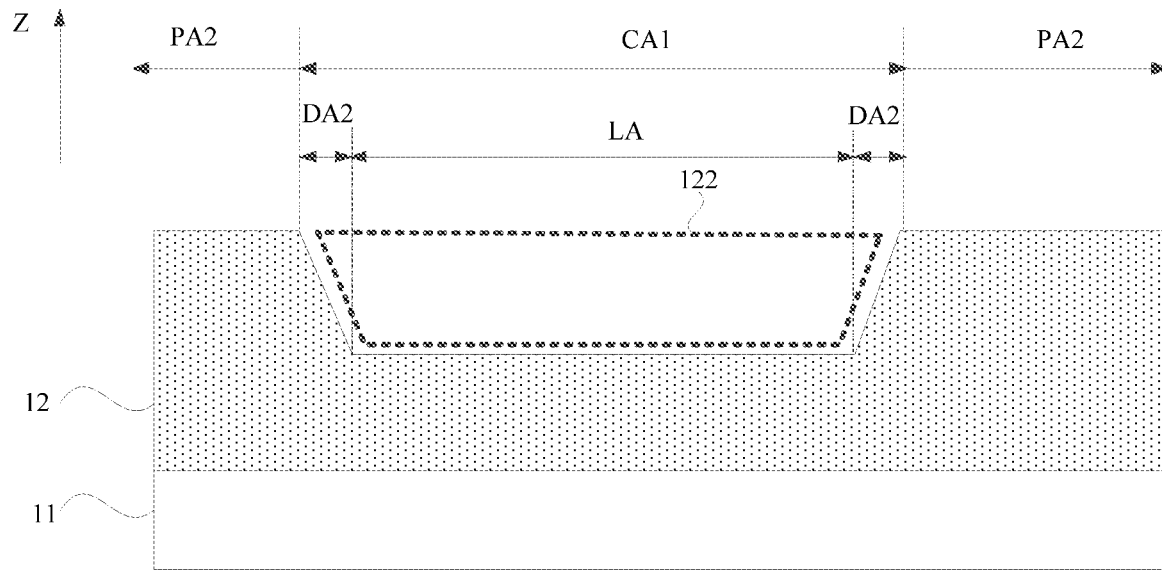
FIG. 20 is a structure diagram of a first insulating layer according to another embodiment of the present disclosure.
Figure 21:
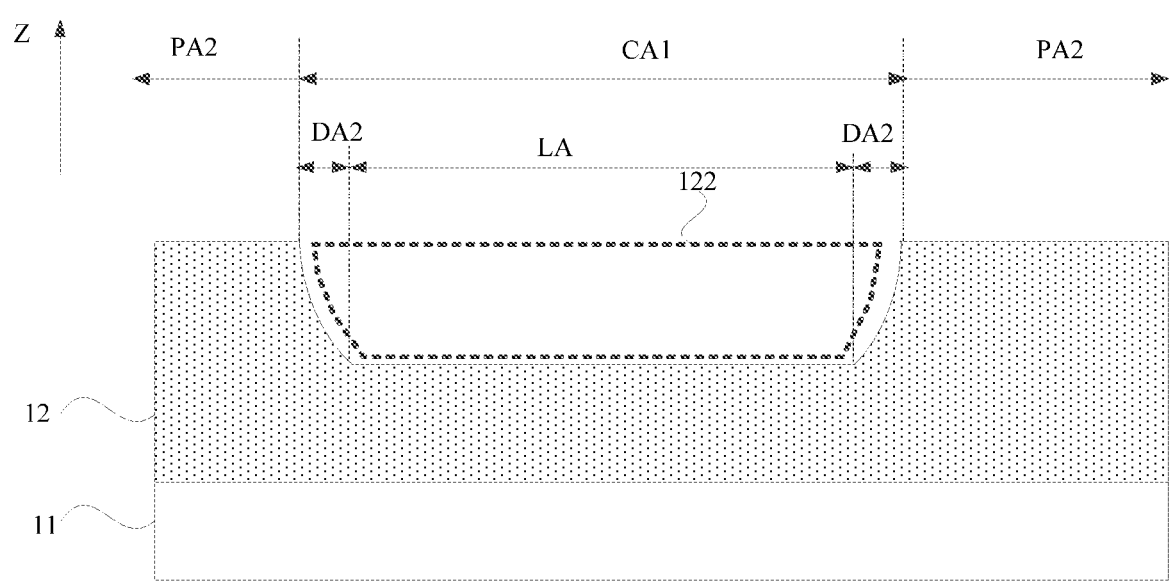
FIG. 21 is a structure diagram of a first insulating layer according to another embodiment of the present disclosure.

FIG. 20 is a structure diagram of a first insulating layer according to another embodiment of the present disclosure. FIG. 21 is a structure diagram of a first insulating layer according to another embodiment of the present disclosure. With reference to FIGS. 20 and 21, in an embodiment, along a direction of the first insulating layer 12 pointing to the base substrate 11, the cross-sectional area of the first groove is gradually decreased.

In an embodiment, the cross-sectional area herein refers to the area of the cross section of the groove in the first groove region CA1, and the cross section is parallel to the plane where the base substrate 11 is located. The first groove region CA1 includes a second transition region DA2 and a lowest region LA. The second transition region DA2 is located in the second planar region PA2 and the lowest region LA. From the direction from the second planar region PA2 to the lowest region LA, the thickness of the first insulating layer 12 in the second transition region DA2 is gradually decreased, and the thickness of the first insulating layer 12 in the whole lowest region LA is the same (regardless of process errors). The shape of the longitudinal section of the groove in the first groove region CA1 may be set by those skilled in the art according to the actual situation, which is not limited herein, where the longitudinal section is perpendicular to the plane where the base substrate 11 is located. In an embodiment, the longitudinal section of the groove may be trapezoidal (as shown in FIG. 20) or "trapezoid-like", the waist of the "trapezoid-like" shape may be curved (as shown in FIG. 21) or polygonal, and the difference between the upper bottom and the lower bottom of the trapezoid may be set by those skilled in the art according to the actual situation.

It is understood that the second planar region PA2 is transitioned to the lowest region LA through the second transition region DA2 so that the thickness of the first insulating layer 12 is gradually decreased from the second planar region PA2 to the lowest region. In this way, a sudden change of the thickness of the first insulating layer 12 can be avoided, thereby preventing the first signal line 211 from breaking at the junction of the second planar region PA2 and the lowest region.

Figure 22:
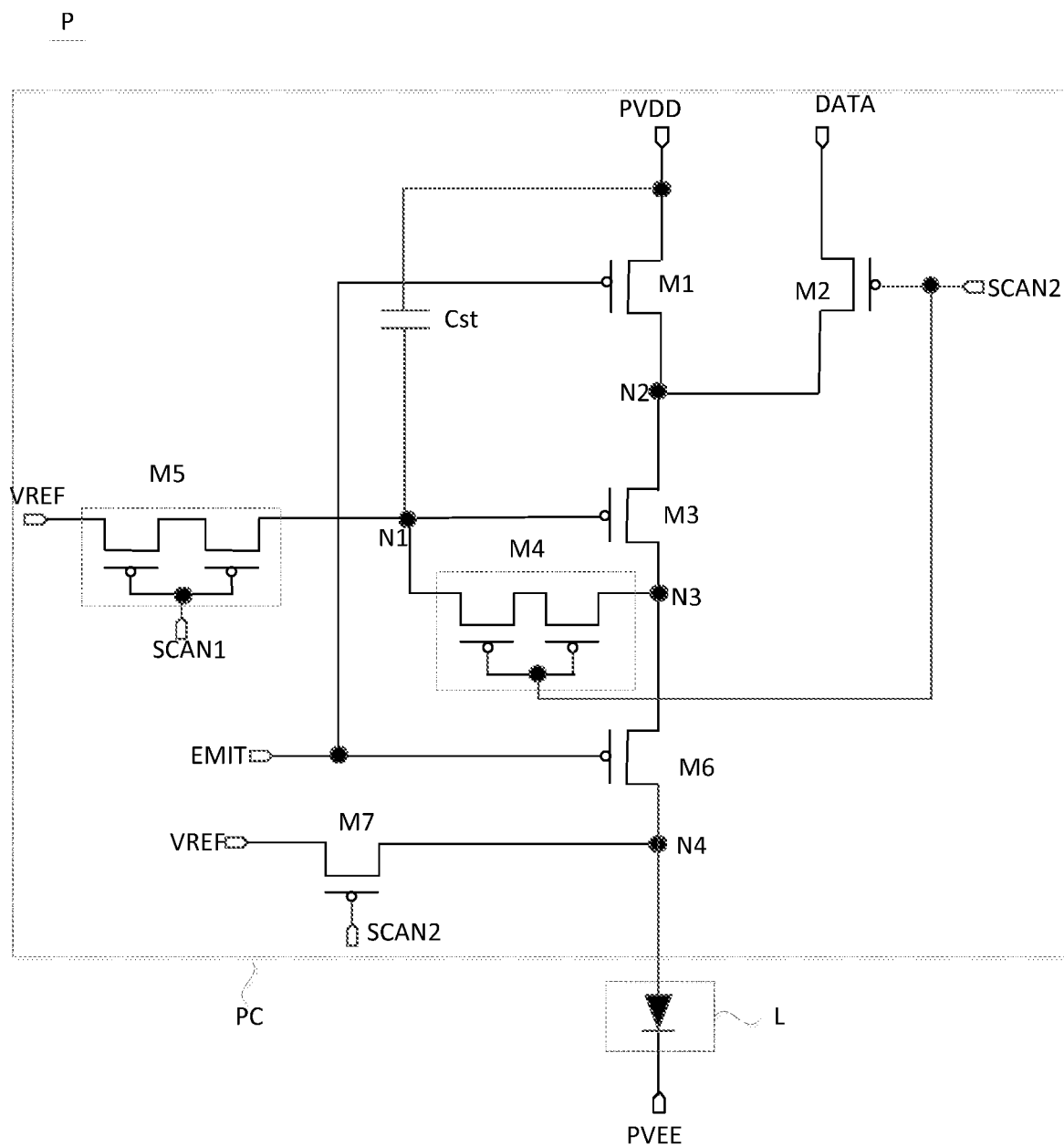
FIG. 22 is a schematic diagram of circuit elements of a pixel circuit according to an embodiment of the present disclosure.
Figure 23:
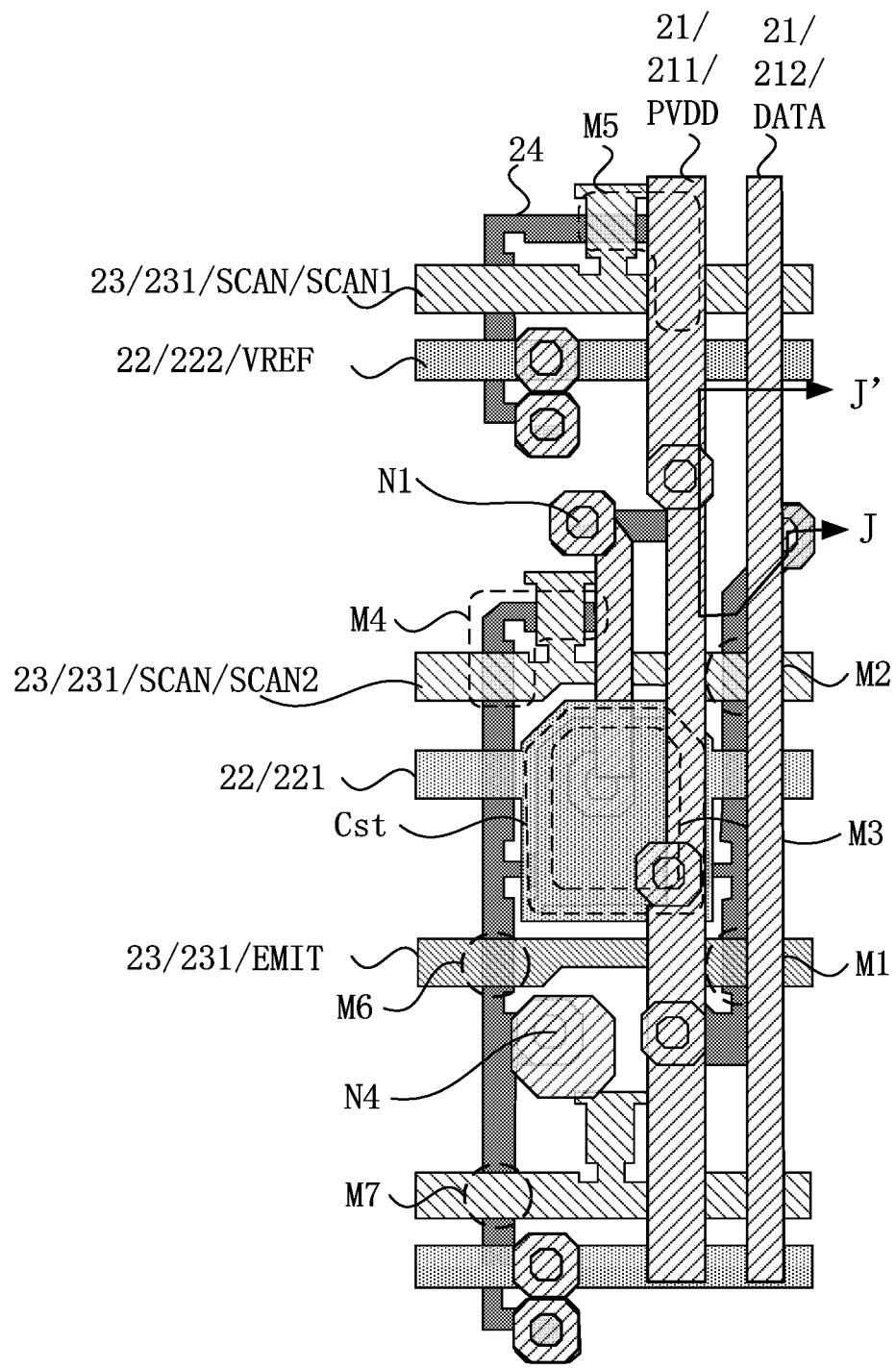
FIG. 23 is a layout of a display panel according to an embodiment of the present disclosure.
Figure 24:
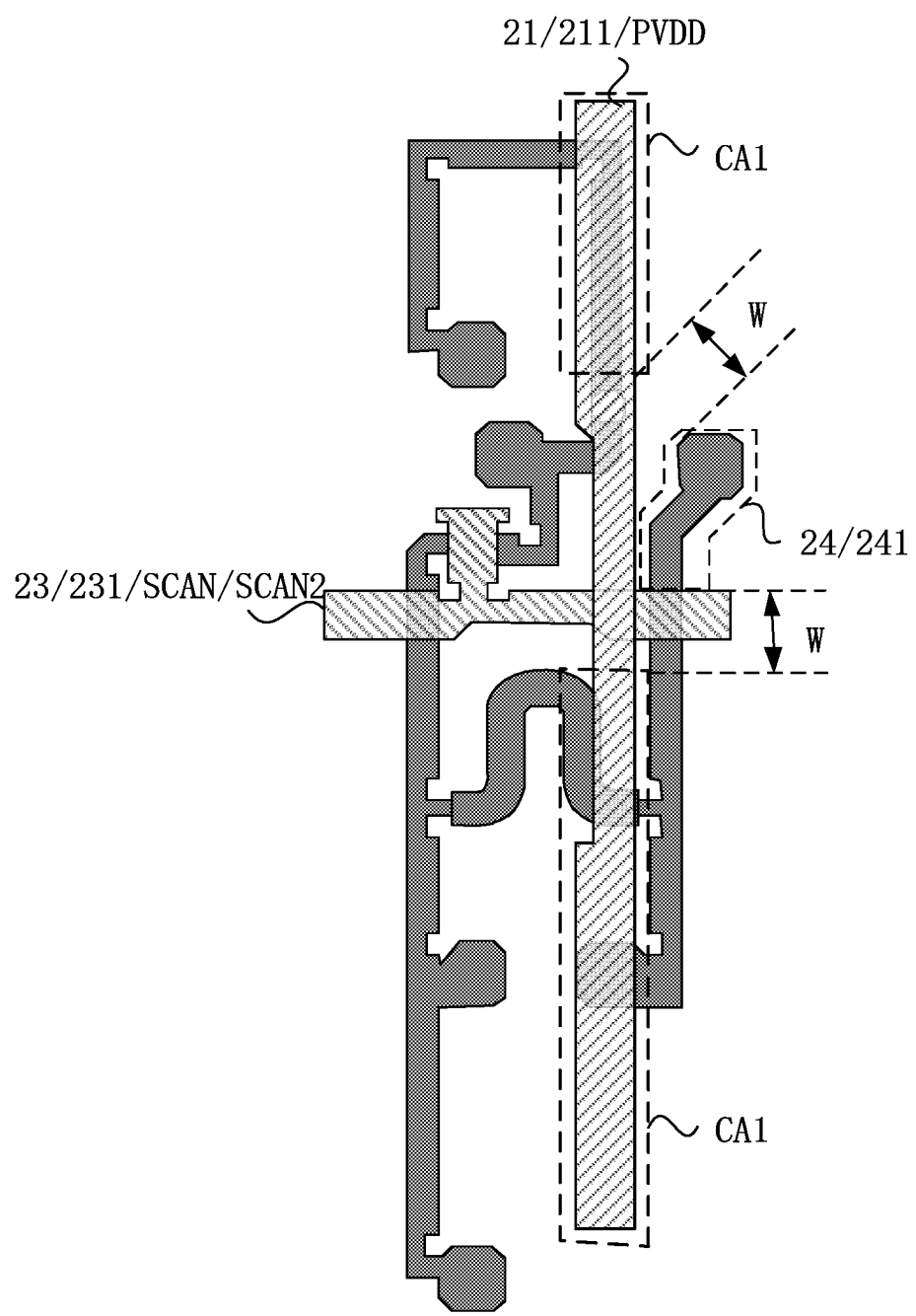
FIG. 24 is a layout of a semiconductor layer, a first signal line, and a second scan line in FIG. 23.

FIG. 22 is a schematic diagram of circuit elements of a pixel circuit according to an embodiment of the present disclosure. FIG. 23 is a layout of a display panel according to an embodiment of the present disclosure. FIG. 24 is a layout of a semiconductor layer, a first signal line, and a second scan line in FIG. 23. With reference to FIGS. 22 to 24, the display panel further includes a semiconductor layer 24. The semiconductor layer 24 is located on a side of the first insulating layer 12 facing the base substrate 11. The semiconductor layer 24 includes a first active portion 241. The first active portion 241 is electrically connected with the second signal line 212. The minimum interval W is provided between an orthographic projection of the first groove region CA1 on a plane where the semiconductor layer 24 is located and the first active portion 241, and the minimum interval W is greater than a preset distance.

With continued reference to FIGS. 15 and 22, the pixel P includes a pixel circuit PC and a light-emitting element L. The pixel circuit PC is used for driving the light-emitting element L to emit light. The specific circuit configuration of the pixel circuit PC may be set by those skilled in the art according to the actual situation, which is not limited herein. In an embodiment, the pixel circuit PC includes a "7T1C" pixel circuit PC (as shown in FIG. 22) or a "2T1C" pixel circuit PC, where "T" herein refers to a transistor and "C" refers to a capacitor. Generally, no matter which pixel circuit PC includes a data write transistor, when the second signal line 212 includes a data signal line, the first electrode of the data write transistor M2 is electrically connected with the second signal line 212, and when the electrical connection is represented in the layout of the display panel, the second signal line 212 is electrically connected with the first active portion 241 by puncturing.

In an embodiment, the patterned semiconductor layer 24 includes multiple semiconductor blocks among which a semiconductor block that is directly electrically connected with the second signal line 212 by puncturing is the first active portion 241. For any point on the first active portion 241, this point has a minimum distance from the orthographic projection of the first groove region CA1 on the plane where the semiconductor layer 24 is located, and the minimum distance is the distance from the first groove region CA1 to the orthographic projection of the first groove region CA1 on the plane where the semiconductor layer 24 is located. Among the distance from each point on the first active portion 241 to the orthographic projection of the first groove region CA1 on the plane where the semiconductor layer 24 is located, there is the minimum value, and the minimum value is the minimum interval W. It is to be noted that the specific value of the preset distance may be set by those skilled in the art according to the actual situation, which is not limited herein. In an embodiment, the preset distance is greater than or equal to 3 um.

Figure 25:
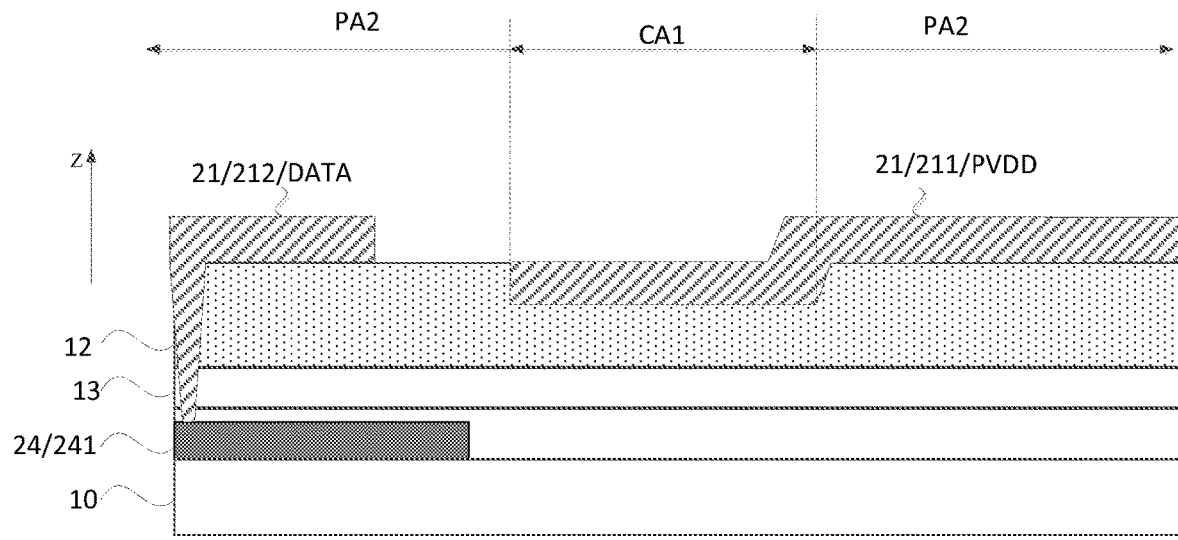
FIG. 25 is a cross-sectional view along direction JJ' of FIG. 23.

FIG. 25 is a cross-sectional view along direction JJ' of FIG. 23. With reference to FIG. 25, it is understood that since the second signal line 212 is directly electrically connected with the first active portion 241 by puncturing, the potential on the first active portion 241 is the same as the potential on the second signal line 212. When the sunken part of the first signal line 211 (the part of the first signal line 211 that is displaced to the first groove region CA1) is close to the first active portion 241, the distance between the sunken part of the first signal line 211 and the first active portion 241 is decreased, and the coupling capacitance between the first active portion 241 and the first signal line 211 is increased, which may cause a phenomenon that the reduction amount of the coupling capacitance between the first signal line 211 and the second signal line 212 is less than or equal to the increase amount of the coupling capacitance between the first signal line 211 and the first active portion 241, and finally the effect of improving signal crosstalk may not be achieved. However, in the present application, the minimum interval is set to be provided between the orthographic projection of the first groove region CA1 on the plane where the semiconductor layer 24 is located and the first active portion 241 so that the space distance between the sunken part of the first signal line 211 and the first active portion 241 can be large enough to enable the reduction amount of the coupling capacitance between the first signal line 211 and the second signal line 212 to be greater than the increase amount of the coupling capacitance between the first signal line 211 and the first active portion 241, thereby finally achieving the effect of reducing the coupling capacitance and improving the crosstalk problem.

It is noted that for clarity, the insulating layer between two adjacent conductive layers is not shown in FIG. 23, but it should be known to those skilled in the art that an insulating layer can be provided between two adjacent conductive layers. Therefore, an insulating layer between two adjacent conductive layers is shown in FIG. 25.

Figure 26:
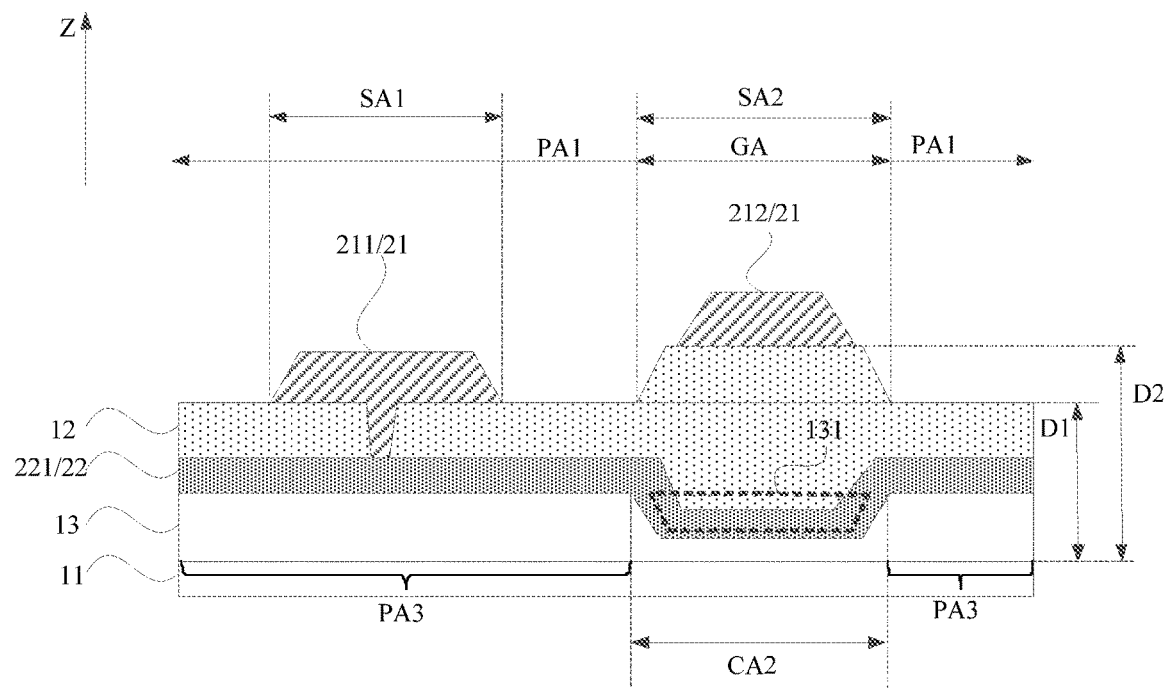
FIG. 26 is a cross-sectional view along direction HH' of FIG. 15.
Figure 27:
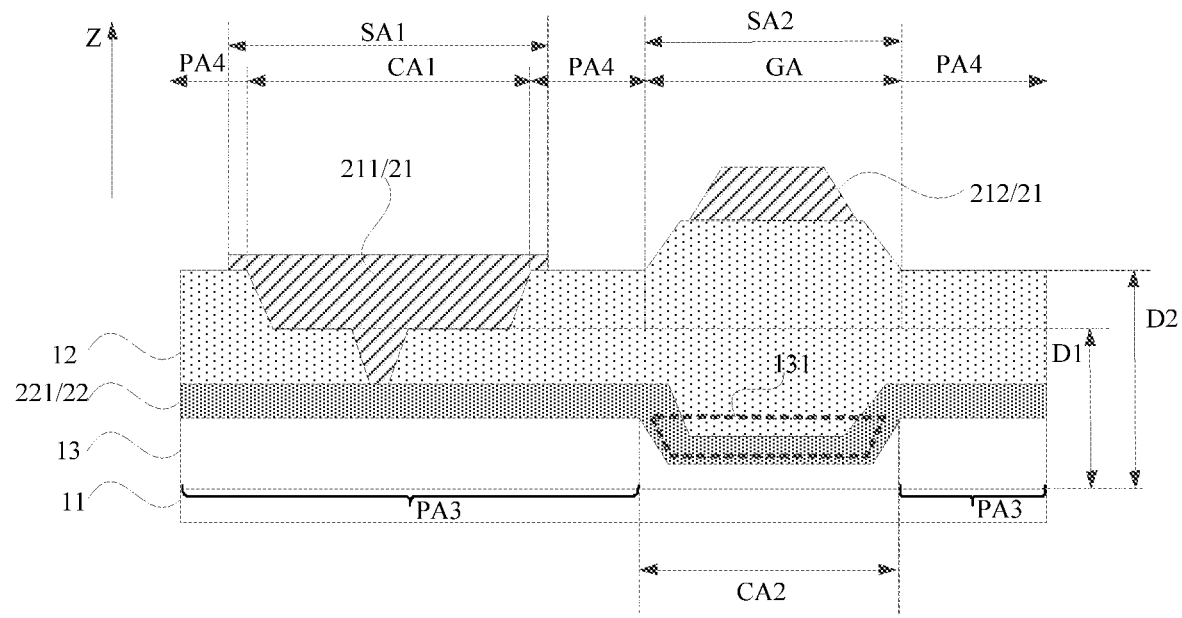
FIG. 27 is another cross-sectional view along direction HH' of FIG. 15.

FIG. 26 is a cross-sectional view along direction HH' of FIG. 15. FIG. 27 is another cross-sectional view along direction HH' of FIG. 15. With reference to FIGS. 26 and 27, in an embodiment, the display panel further includes a second metal layer 22 and a second insulating layer 13. The second metal layer 22 is located on a side of the first metal layer 21 facing the base substrate 11, and the second insulating layer 13 is located on a side of the second metal layer 22 facing the base substrate 11. The second metal layer 22 is provided with a third signal line 221, and the third signal line 221 is electrically connected with the first signal line 221 and extends along a second direction X, where the first direction Y and the second direction X cross. The second insulating layer 13 includes a second groove region CA2, a third planar region PA3, and a via region. Along the direction perpendicular to the plane where the base substrate 11 is located, the thickness of the second insulating layer 13 located in the second groove region CA2 and the thickness of the second insulating layer 13 located in the via region each are less than the thickness of the second insulating layer 13 located in the third planar region PA3. Along the direction perpendicular to the plane where the base substrate 11 is located, the third signal line 221 is at least partially located in the second groove region CA2.

In an embodiment, each of third signal lines 221 may be set to be at least partially located in the second groove region CA2, or a partial number of third signal lines 221 may be set to be at least partially located in the second groove region CA2, which is not limited herein.

In an embodiment, the first signal line 211 and the third signal line 221 may be electrically connected through a via, and the first signal line 211 and the third signal line 221 transmit the same signal. In this way, the first signal line 211 extending along the first direction Y and the third signal line 221 extending along the second direction X cross to form the grid shape and are uniformly distributed in the display panel, thereby facilitating the uniformity of signals transmitted on the first signal line 211 and the third signal line 221, reducing the voltage drop of the first signal line 211 and the third signal line 221, and further improving the display effect. In an embodiment, the first signal line 211 and the third signal line 221 include a power signal line.

In an embodiment, when there is no other conductive film layer between the second metal layer 22 and the base substrate 11, the second insulating layer 13 refers to an insulating layer between the second metal layer 22 and the base substrate 11; and when there are other conductive film layers between the second metal layer 22 and the base substrate 11, the second insulating layer 13 refers to an insulating layer between the second metal layer 22 and a conductive film layer closest to the second metal layer 22. The second insulating layer 13 acts as an insulator and a carrier of the second metal layer 22. The material and thickness of the second insulating layer 13 may be set by those skilled in the art according to the actual situation, which is not limited herein.

In an embodiment, the second groove region CA2 is provided with a second groove 131, and the degree to which the second groove 131 penetrates the second insulating layer 13 may be set by those skilled in the art according to the actual situation, which is not limited herein. In an embodiment, the second insulating layer 13 is prepared with the same material and by the same preparation process. The second groove 131 at least partially penetrates the second insulating layer 13 (as shown in FIG. 26), where "at least partially penetrating" means that when the second groove 131 penetrates the second insulating layer 13, the second groove 131 forms a through hole, and when the second groove 131 partially penetrates the second insulating layer 13, the thickness of the second insulating layer 13 in the location where the second groove 131 is located is greater than zero. In an embodiment, the second insulating layer 13 includes at least one second insulating sub-layer. The second groove region CA2 includes a second groove, and the second groove at least partially penetrates the at least one second insulating sub-layer; where for the understanding of the "second insulating layer at least partially penetrating", reference may be made to explanation of the "second insulating layer 13 at least partially penetrating", which is not repeated herein.

In an embodiment, in the preparation process of the first insulating layer 12, through the patterning process, the second insulating layer 13 in the second groove region CA2 is thinned while the first insulating layer 12 in the third planar region PA3 is not thinned or thinned to a small extent so that the thickness of the second insulating layer 12 in the second groove region GA2 is less than the thickness of the second insulating layer 13 in the third planar region PA3. When the second insulating layer 13 in the second groove region GA2 and the second insulating layer 13 in the third planar region PA3 each are thinned, the third insulating layer 13 may be patterned by half-masking.

It is understood that at least part of the third signal line 221 is sunk so that the entire space distance between the third signal line 221 and the second signal line 212 can be further increased, thereby further improving the problem of signal crosstalk between the first signal line 211 and the second signal line 212 and improving the display effect of the display panel.

In an embodiment, the first signal line 211 and the third signal line 221 may include a power signal line and the second signal line 212 may include a data signal line so that the third signal line 221 may be at least partially sunk with respect to the data signal line, thereby increasing the space distance between the power signal line and the third signal line 221 and improving the crosstalk problem between the power signal line and the data signal line.

It is noted that the "third planar region PA3" herein refers to a planar region located on the first insulating layer 12, and the "third" is used only to distinguish this planar region from other planar regions located on the first insulating layer 12. The "third planar region PA3" refers to an region where no pad or groove treatment is performed on the second insulating layer 13 and which do not overlap the third signal line in the direction perpendicular to the plane where the base substrate is located. The "third planar region PA3" serves as the reference, and the "third planar region PA3" is the reference of the depression of the second groove region CA2.

Figure 28:
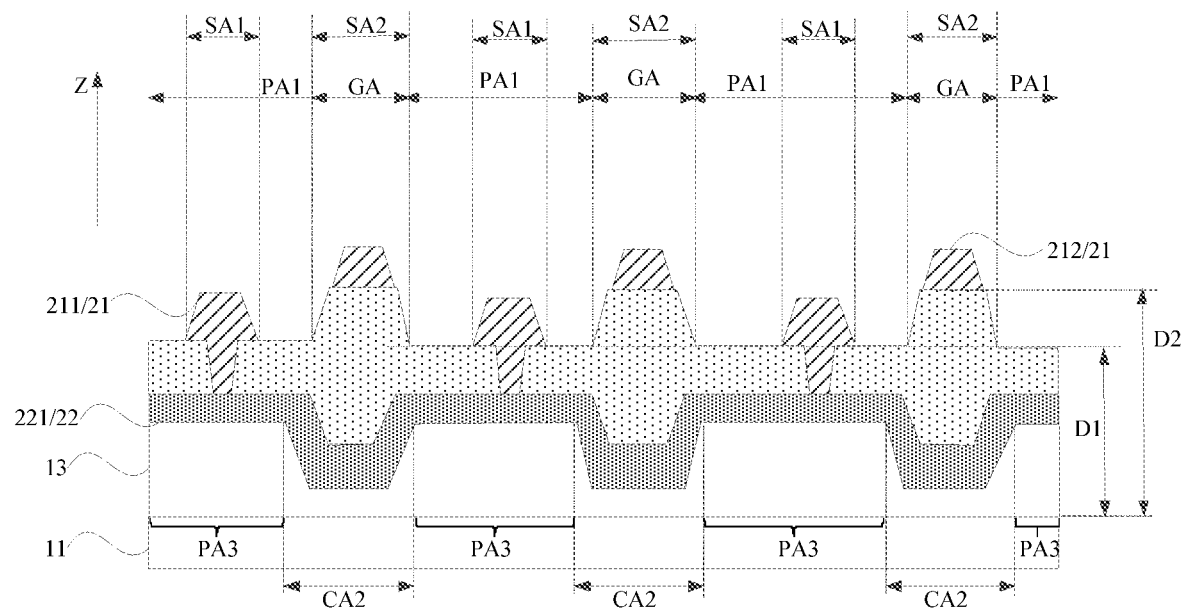
FIG. 28 is a cross-sectional view along direction II' of FIG. 15.
Figure 29:
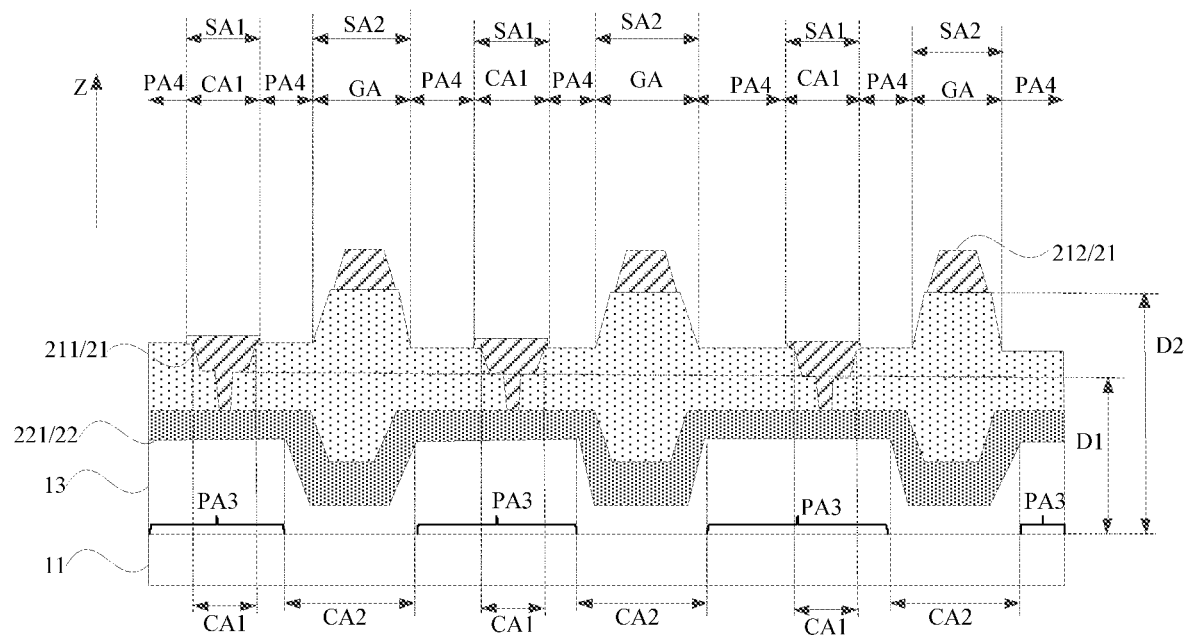
FIG. 29 is another cross-sectional view along direction II' of FIG. 15.

FIG. 28 is a cross-sectional view along direction II' of FIG. 15. FIG. 29 is another cross-sectional view along direction II' of FIG. 15. With reference to FIGS. 28 and 29, optionally, along the direction perpendicular to the plane where the base substrate 11 is located, the third signal line 221 overlaps the second signal line 212 in an overlapping region, and the second groove region CA2 at least partially overlaps the overlapping region.

It is understood that the second signal line 212 is set to at least partially overlap the second groove region CA2 so that in the second groove region CA2, the distance between the second signal line 212 and the third signal line 221 in the direction Z perpendicular to the plane where the base substrate is located can be increased, thereby reducing the capacitance formed between the second signal line 212 and the third signal line 221 and facilitating the improvement of the crosstalk problem.

It is to be noted that the overlapping degree of the setting region of the third signal line 221 and the pad region GA along the direction Z perpendicular to the plane where the base substrate is located may be set by those skilled in the art according to the actual situation, which is not limited herein.

On the basis of the preceding technical solutions, in an embodiment, the dielectric constant of the first insulating layer 12 is less than a preset dielectric constant threshold.

It is understood that when at least part of the second signal line 212 is dispose in the pad region GA or at least part of the first signal line 211 is disposed in the first groove region CA1, if the first signal line 211 at least partially overlaps the second signal line 212 in the second direction X, a lateral coupling capacitance is also formed between the first signal line 211 and the second signal line 212, and the dielectric material of the lateral coupling capacitance at least partially includes a first insulating layer 12. The smaller the dielectric constant of the first insulating layer 12, the more favorable it is to reduce the lateral coupling capacitance.

It is also understood that when the display panel further includes a second metal layer 22 that includes a third signal line 221 extending in the second direction X, the dielectric material of the coupling capacitance formed by the second signal line 212 and the third signal line 221 includes a first insulating layer 12, and the smaller the dielectric constant of the first insulating layer 12, the more favorable it is to reduce the coupling capacitance, thereby further improving the crosstalk problem.

It is noted that the material of the first insulating layer 12 may be set by those skilled in the art according to the actual situation, which is not limited herein, as long as the dielectric constant of the first insulating layer 12 is less than the preset dielectric constant threshold. In an embodiment, the first insulating layer 12 includes at least one of silicon oxide or silicon nitride. In this way, the lateral coupling capacitance formed by the first signal line 211 and the second signal line 212 and the coupling capacitance formed by the second signal line 212 and the third signal line 221 can be reduced, thereby improving the crosstalk problem and ensuring the display effect.

Figure 30:
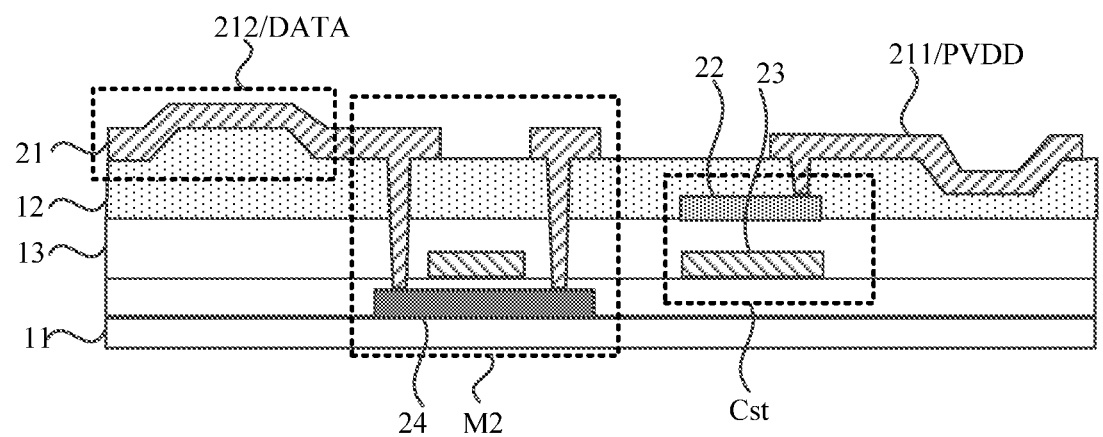
FIG. 30 is a structure diagram of a display panel according to an embodiment of the present disclosure.

FIG. 30 is a structure diagram of a display panel according to an embodiment of the present disclosure. With reference to FIGS. 30 and 23, in an embodiment, the display panel further includes a second metal layer 22 and a third metal layer 23, where the second metal layer 22 is located on a side of the first metal layer 21 facing the base substrate 11, and the third metal layer 23 is located on a side of the second metal layer 22 facing the base substrate 11; a fourth signal line 222, where the fourth signal line 222 is located in the second metal layer 22 and extends along a second direction X, and the second direction X and the first direction Y cross; a fifth signal line 231, where the fifth signal line 231 is located in the third metal layer 23 and extends along the second direction X; a transistor, where the gate of the transistor is located in the third metal layer 23, the source and the drain of the transistor are located in the first metal layer 21; and a capacitor, where two plates of the capacitor are respectively located in the third metal layer 23 and the second metal layer 22.

In an embodiment, the fourth signal line 222 may include a reference voltage signal line VREF, the fifth signal line 231 may include a gate voltage signal line 231, and the gate voltage signal line 231 may include a scan signal line SCAN and a light emission control signal line EMIT.

In an embodiment, with continued reference to FIGS. 15 and 16, the "7T1C" pixel circuit includes a first reset transistor M5, a data write transistor M2, a drive transistor M3, a threshold compensation transistor M4, a first light emission control transistor M1, a second light emission control transistor M6, a second reset transistor M7, and a storage capacitor Cst. The first electrode of the data write transistor M2 is electrically connected with the data signal line DATA. The gate of the data write transistor M2 and the gate of the threshold compensation transistor M4 each are electrically connected with the second scan signal line SCAN2. The first electrode of the first reset transistor M5 and the first electrode of the second reset transistor M7 are each electrically connected with the initialization line VREF. The gate of the first reset transistor M5 is electrically connected with the first scan signal line SCAN1. The gate of the second reset transistor M7 is electrically connected with the second scan signal line SCAN2. The gate of the first light emission control transistor M1 and the gate of the second light emission control transistor M6 each are electrically connected with the light emission control signal line EMIT. The first electrode of the first light emission control transistor M1 is electrically connected with the first signal line PVDD (also called the first power signal line). The first electrode of the second light emission control transistor M6 is electrically connected with the anode of the first light-emitting element LL. The cathode of the first light-emitting element LL is electrically connected with the second power signal line PVEE. In an embodiment, the first reset transistor M5 and the threshold compensation transistor M4 may be double-gate transistors. Accordingly, the reference voltage signal line VREF supplies reference voltage signals to the first reset transistor M5 and the second reset transistor M7. The scan signal line SCAN includes a first scan signal line SCAN1 and a second scan signal line SCAN2. The first scan signal line SCAN1 supplies a first scan signal to the gate of the first reset transistor M5. The second scan signal line SCAN2 supplies second scan signals to the gate of the data write transistor M2, the gate of the threshold compensation transistor M4, and the gate of the second reset transistor M7. The light emission control signal line EMIT is electrically connected with the gate of the first light emission control transistor M1 and the gate of the second light emission control transistor M6, and supplies light emission control signals to the gate of the first light emission control transistor M1 and the gate of the second light emission control transistor M6. The first signal line 211 and the third signal line 221 may input power signals to the first electrode of the first light emission control transistor M1, and the second signal line 212 may input a data voltage signal to the first electrode of the data write transistor M2.

It is noted that FIG. 30 only illustrates that the first insulating layer 12 includes a pad region and the first groove region but is not limited thereto, and the first insulating layer 12 may be set by those skilled in the art according to the actual situation. In an embodiment, the first insulating layer 12 may also be set to only include a pad region or only include a first groove region, and the second insulating layer 13 may also be set to include a second groove region.

It is noted that in FIGS. 1-30, in order to clearly show whether each structure in the display panel is located in the same layer, the structures located in the same metal layer are labeled with the same filling pattern.

An embodiment of the present application further provides a display device. This display device includes the display panel described in any one of the embodiments of the present application. Therefore, the display device provided in the embodiment of present disclosure has beneficial effects of the display panel described in the preceding embodiments. The details are not repeated here.

Figure 31:
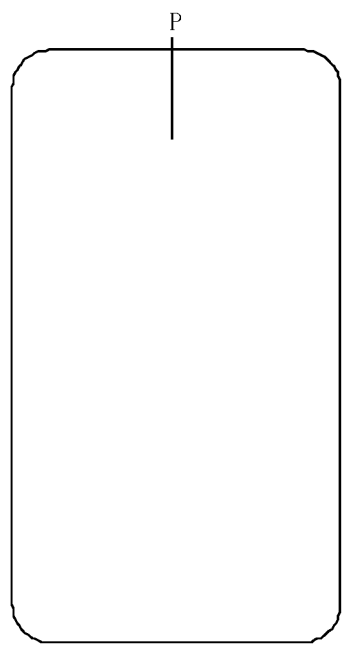
FIG. 31 is a structure diagram of a display device according to an embodiment of the present disclosure.

FIG. 31 is a structure diagram of a display device according to an embodiment of the present disclosure. With reference to FIG. 31, the display device includes the display panel P provided in the preceding embodiments. In an embodiment, the display device may be a mobile phone, a computer, a smart wearable device, etc., which is not limited in the embodiments of the present disclosure.

It is noted that the preceding are only preferred embodiments of the present disclosure and the technical principles used therein. It is to be understood by those skilled in the art that the present disclosure is not limited to the embodiments described herein. For those skilled in the art, various apparent modifications, adaptations, combinations, and substitutions can be made without departing from the scope of the present disclosure. Therefore, while the present disclosure has been described in detail via the preceding embodiments, the present disclosure is not limited to the preceding embodiments and may include more equivalent embodiments without departing from the inventive concept of the present disclosure. The scope of the present disclosure is determined by the scope of the appended claims.

What is claimed is:

1. A display panel, comprising:
a base structure; and
a first signal line and a second signal line that are located on a side of the base substrate, wherein both the first signal line and the second signal line are located in a first metal layer and extend along a first direct direction; and
a distance between at least part of a surface of the first signal line facing the base substrate and a plane where the base substrate is located is D1, and a distance between at least part of a surface of the second signal line facing the base substrate and the plane where the base substrate is located is D2, wherein D1 is not equal to D2;
wherein the display panel further comprises:
a second metal layer and a third metal layer, wherein the second metal layer is located on a side of the first metal layer facing the base substrate, and the third metal layer is located on a side of the second metal layer facing the base substrate;
a fourth signal line, wherein the fourth signal line is located in the second metal layer and extends along a second direction, and the second direction and the first direction cross;
a fifth signal line, wherein the fifth signal line is located in the third metal layer and extends along the second direction;
a transistor, wherein a gate of the transistor is located in the third metal layer, a source and a drain of the transistor are located in the first metal layer; and
a capacitor, wherein two plates of the capacitor are respectively located in the third metal layer and the second metal layer.

2. The display panel of claim 1, wherein
the display panel further comprises a first insulating layer, wherein the first insulating layer is located on a side of the first metal layer facing the base substrate;
the display panel further comprises a first signal line setting region and a second signal line setting region, wherein along a direction perpendicular to the plane where the base substrate is located, the first signal line is located in the first signal line setting region, and the second signal line is located in the second signal line setting region; and
along the direction perpendicular to the plane where the base substrate is located, a thickness of the first insulating layer at least partially located in the first signal line setting region is different from a thickness of the first insulating layer at least partially located in the second signal line setting region.

3. The display panel of claim 2, wherein
the first insulating layer further comprises a first planar region, the second signal line setting region comprises a pad region, and along the direction perpendicular to the plane where the base substrate is located, a thickness of the first insulating layer located in the pad region is greater than a thickness of the first insulating layer located in the first planar region.

4. The display panel of claim 3, wherein along a direction perpendicular to the base substrate, the second signal line is located in the pad region.

5. The display panel of claim 3, wherein the display panel further comprises:
a third signal line, wherein the third signal line is electrically connected with the first signal line, and the third signal line is located in a second metal layer and extends along a second direction; wherein the first direction and the second direction cross; and
along the direction perpendicular to the plan where the base substrate is located, the third signal line at least partially overlaps the pad region.

6. The display panel of claim 3, wherein along a direction of the base substrate pointing to the first insulating layer, a cross-sectional area of the first insulating layer located in the pad region is gradually decreased.

7. The display panel of claim 2, wherein the first insulating layer is prepared with a same material and by a same preparation process.

8. The display panel of claim 7, wherein the first insulating layer comprises at least one of silicon oxide or silicon nitride.

9. The display panel of claim 2, wherein a dielectric constant of the first insulating layer is less than a preset dielectric constant threshold.

10. The display panel of claim 1, wherein the first signal line and the second signal line are one of a first power signal line and a data signal line, respectively.

11. A display device, comprising a display panel, where the display panel comprises:
- a base substrate; and
- a first signal line and a second signal line that are located on a side of the base substrate, wherein both the first signal line and the second signal line are located in a first metal layer and extend along a first direction; and
- a distance between at least part of a surface of the first signal line facing the base substrate and a plane where the base substrate is located is D1, and a distance between at least part of a surface of the second signal line facing the base substrate and the plane where the base substrate is located is D2, wherein D1 is not equal to D2;

wherein the display panel further comprises:
- a second metal layer and a third metal layer, wherein the second metal layer is located on a side of the first metal layer facing the base substrate, and the third metal layer is located on a side of the second metal layer facing the base substrate;
- a fourth signal line, wherein the fourth signal line is located in the second metal layer and extends along a second direction, and the second direction and the first direction cross;
- a fifth signal line, wherein the fifth signal line is located in the third metal layer and extends along the second direction;
- a transistor, wherein a gate of the transistor is located in the third metal layer, a source and a drain of the transistor are located in the first metal laver; and
- a capacitor, wherein two plates of the capacitor are respectively located in the third metal layer and the second metal layer.

* * * * *